(12) United States Patent
Dai et al.

(10) Patent No.: US 10,347,798 B2
(45) Date of Patent: Jul. 9, 2019

(54) PHOTOLUMINESCENCE MATERIAL COATING OF LED CHIPS

(71) Applicant: Intematix Corporation, Fremont, CA (US)

(72) Inventors: Bing Dai, Fremont, CA (US); Xianglong Yuan, Manteca, CA (US); Yi-Qun Li, Danville, CA (US)

(73) Assignee: Intematix Corporation, Fremont, CA (US)

(*) Notice: Subject to any disclaimer, the term of this patent is extended or adjusted under 35 U.S.C. 154(b) by 0 days.

(21) Appl. No.: 15/169,648

(22) Filed: May 31, 2016

(65) Prior Publication Data

US 2017/0025582 A1    Jan. 26, 2017

Related U.S. Application Data

(60) Provisional application No. 62/169,446, filed on Jun. 1, 2015, provisional application No. 62/249,058, filed on Oct. 30, 2015, provisional application No. 62/334,376, filed on May 10, 2016.

(51) Int. Cl.
*H01L 33/50* (2010.01)

(52) U.S. Cl.
CPC .......... *H01L 33/502* (2013.01); *H01L 33/505* (2013.01); *H01L 2933/0041* (2013.01)

(58) Field of Classification Search
CPC ...... H01L 33/50; H01L 33/502; H01L 33/505
USPC ......................................................... 257/98
See application file for complete search history.

(56) References Cited

U.S. PATENT DOCUMENTS

| | | |
|---|---|---|
| 5,609,746 A | 3/1997 | Farrar et al. |
| 6,114,048 A | 9/2000 | Jech et al. |
| 6,120,131 A | 9/2000 | Murthy et al. |
| 6,515,417 B1 | 2/2003 | Duggal et al. |
| 7,585,751 B2 | 9/2009 | Kirihara et al. |
| 7,804,099 B2 | 9/2010 | Beeson et al. |
| 7,863,160 B2 | 1/2011 | Iizuka |
| 7,897,488 B2 | 3/2011 | Watanabe et al. |
| 8,173,246 B2 | 5/2012 | Nashiki et al. |
| 2002/0097962 A1 | 7/2002 | Yoshimura et al. |
| 2004/0061056 A1 | 4/2004 | Barton et al. |
| 2004/0207323 A1 | 10/2004 | Erchak et al. |
| 2005/0274967 A1 | 12/2005 | Martin et al. |
| 2006/0009008 A1 | 1/2006 | Kaneuchi et al. |
| 2006/0138443 A1* | 6/2006 | Fan .......................... H01L 33/56 257/100 |
| 2008/0020548 A1 | 1/2008 | Morikazu et al. |
| 2008/0042153 A1 | 2/2008 | Beeson et al. |
| 2008/0132035 A1 | 6/2008 | Kondo |
| 2008/0268619 A1 | 10/2008 | Nakamura |
| 2009/0179207 A1 | 7/2009 | Chitnis et al. |
| 2010/0295077 A1* | 11/2010 | Melman .................. H01L 33/50 257/98 |
| 2010/0295078 A1 | 11/2010 | Chen et al. |
| 2010/0304551 A1 | 12/2010 | Takanashi et al. |

* cited by examiner

*Primary Examiner* — Monica D Harrison
(74) *Attorney, Agent, or Firm* — Vista IP Law Group, LLP

(57) ABSTRACT

A photoluminescence sheet comprises a polymer sheet having particles of at least one photoluminescence material homogeneously distributed throughout its volume. The polymer sheet comprises a UV-curable polymer that is partially cured and which is thermally re-flowable before being fully cured by exposure to UV light.

23 Claims, 35 Drawing Sheets

SECTION A-A

SECTION A-A

PHOTOLUMINESCENCE MATERIAL COATING OF LED CHIPS

CROSS-REFERENCE TO RELATED APPLICATIONS

This application claims the benefit of priority to U.S. Provisional Application No. 62/169,446, filed 1 Jun. 2015, U.S. Provisional Application No. 62/249,058, filed 30 Oct. 2015, and U.S. Provisional Application No. 62/334,376, filed 10 May 2016, which are all hereby incorporated by reference in their entirety.

FIELD

This disclosure relates to photoluminescence wavelength converted LEDs (Light Emitting Diodes) and methods of applying a coating of photoluminescence material, typically phosphor, directly to the light emitting faces of LED chips. More particularly, although not exclusively, embodiments of the invention concern methods, apparatus and phosphor film for applying a phosphor coating on LED flip-chips.

BACKGROUND

Increasingly, white light emitting LEDs ("white LEDs") are being used to replace conventional fluorescent, compact fluorescent and incandescent light sources in virtually all applications. White LEDs generally include one or more photoluminescence materials (e.g., one or more phosphor materials), which absorb a portion of the radiation emitted by the LED and re-emit light of a different color (wavelength). Typically, the LED generates blue light and the phosphor(s) absorbs a percentage of the blue light and re-emits yellow, green, or a combination of green and yellow light. The portion of the blue light generated by the LED that is not absorbed by the phosphor material combined with the light emitted by the phosphor provides light which appears to the eye as being white in color.

Commonly, white LEDs comprise one or more blue LED chips mounted within a cavity of a package which is then filled with an encapsulant containing the one or more phosphor materials. A disadvantage of such white LEDs is the relatively high cost of the package. Recently, attention has focused on producing white LEDs that avoid expensive packaging by applying phosphor directly to unpackaged LED chips, so called Chip Scale Packaging (CSP) solutions. The present invention concern apparatus and methods of applying coating of photoluminescence materials directly to LED chips.

SUMMARY OF THE INVENTION

Embodiments of the invention relate to photoluminescence sheet materials (for example phosphor films) and to methods and apparatus for applying such preformed phosphor films onto the light emitting faces of LED chips, in particular although not exclusively LED flip-chips. Embodiments of the invention further comprise white light emitting devices comprising an LED chip with a photoluminescence wavelength conversion layer on a light emitting top face and light emitting side faces of the chip.

According to an embodiment of the invention a photoluminescence sheet comprises: a polymer sheet having particles of at least one photoluminescence material homogeneously distributed throughout its volume wherein, the polymer sheet comprises a UV-curable polymer that is partially cured and which is thermally re-flowable before being fully cured by exposure to UV light. In some embodiments the polymer sheet comprises a partially cured, UV-curable resin, such as a silicone or epoxy resin. In some embodiments the polymer sheet comprises a partially cured, UV-curable urethane acrylate resin, a partially cured, UV-curable acrylic acrylate resin or a partially cured, UV-curable epoxy acrylate resin.

The thickness of the photoluminescence sheet can be up to about 150 μm depending on the color of light the sheet is intended to generate and the intended application. Typically, a minimum thickness of the photoluminescence sheet is about 50 μm for the sheet to be practical to handle during application to an LED chip. For a photoluminescence sheet intended to generate "cool white" light with a CCT (Correlated Color Temperature) greater than about 5600K for lighting applications, the photoluminescence sheet is of a thickness of about 50 μm to about 70 μm. Conversely, for a photoluminescence sheet intended to generate "warm white" light with a CCT of less than about 3000K the photoluminescence sheet is of a thickness of about 70 μm to about 100 μm. For a photoluminescence sheet intended to generate white light with a high CRI (Color Rendering Index), typically greater than 90 CRI, the photoluminescence sheet can be of a thickness up to about 150 μm.

To ensure a uniform color of light generation over the entire surface of the photoluminescence sheet, a variation of thickness of the photoluminescence sheet is less than about 2%. Such a uniformity of photoluminescence sheet thickness has been found to give a uniformity in color of generated light of less than about two MacAdam ellipses on a CIE 1931 chromaticity diagram.

The weight loading of the at least one photoluminescence material can be between about 40% and about 70% of the total sheet weight and is a balance between keeping the sheet thickness as thin as possible to maximize conformability, while maintaining the integrity, re-formability and adhesion of the photoluminescence sheet suitable for application to LED chips. For example, where the photoluminescence sheet is intended to generate "cool white" light a weight loading of the at least one photoluminescence material can be between about 40% and about 50% of the total sheet weight. Where the photoluminescence sheet is intended to generate "warm white" light, which requires additional orange to red light emitting photoluminescence material(s), the weight loading of photoluminescence material can be between about 60% and about 70% of the total weight of the photoluminescence sheet. When it is intended that the photoluminescence sheet is used as a backlight for a display application, such applications typically require narrow band photoluminescence materials, the weight loading of the at least one photoluminescence material can be between about 40% and about 70% depending on the photoluminescence material being employed.

To ensure a uniform color of light generation over the entire surface of the photoluminescence sheet, the variation of thickness of the photoluminescence sheet is typically less than about 2%. Such a uniformity of photoluminescence sheet thickness has been found to give a uniformity in color of generated light of less than about two MacAdam ellipses on a CIE 1931 chromaticity diagram.

By using photoluminescence sheets and/or methods and apparatus according to embodiments of the invention enables the manufacture of white light emitting devices with improved optical characteristics compared with the known devices.

According to an embodiment of the invention a white light emitting device comprises: an LED chip having a light emitting top face, light emitting side faces and bottom face; and a wavelength converting layer of substantially uniform thickness covering the light emitting top face and light emitting side faces of the LED chip, wherein the wavelength converting layer comprises a preformed photoluminescence sheet comprising particles of at least one photoluminescence material that is applied to the light emitting faces of the LED chip and wherein the wavelength conversion layer is a thickness of between about 50 µm and about 150 µm and wherein a thickness of the wavelength conversion layer on the light emitting side faces of the LED chip is between about 95% and 100% of the thickness of the wavelength conversion layer on the light emitting top face of the LED chip. In contrast, in the known devices, the thickness of the wavelength conversion layer on the light emitting side faces of the LED chip is typically only 75% of the thickness of the wavelength conversion layer on the light emitting top face of the LED chip giving rise to a undesirable difference in color of emitted light from the side and top faces of the LED chip.

The required thickness of the wavelength conversion layer depends at least in part on the color of light that the device is intended to generate and the application in which the device is intended to be used. In embodiments where the device is intended to generate for example "cool white" light for lighting applications, the wavelength conversion layer can be of a thickness of between about 50 µm and about 70 µm. In embodiments where the device is intended to generate "warm white" light for lighting applications the wavelength conversion layer can be of a thickness between about 70 µm and about 100 µm. In embodiments where device intended to generate light with a CRI of greater than 90 CRI, the wavelength conversion layer can be of a thickness up to about 150 µm.

To ensure a uniform color of light generation from all light emitting faces of the device, the wavelength conversion layer advantageously has a variation of thickness of the sheet is typically less than about 2%. White light emitting devices according to such embodiments have been found to give a uniformity in color of generated light of less than about two MacAdam ellipses on a CIE 1931 chromaticity diagram.

In some embodiments the region of the wavelength conversion layer on the light emitting side faces of the LED chip adjacent to the bottom face of the LED chip can extend beyond the wavelength conversion layer on the light emitting side faces of LED chips a distance of up to about 20 µm. In some embodiments the region of the wavelength conversion layer on the light emitting side faces of the LED chip adjacent to the bottom face of the LED chip does not extend beyond the wavelength conversion layer on the light emitting side faces of LED chip. In yet other embodiments the wavelength conversion layer on the light emitting side faces of the LED chip tapers in thickness in the region adjacent to the bottom face of the LED chip.

According to another embodiment of the invention a white light emitting device comprises: an LED chip having a light emitting top face, light emitting side faces and bottom face; and a wavelength conversion layer of substantially uniform thickness covering the light emitting top face and light emitting side faces of the LED chip, wherein the wavelength conversion layer comprises a preformed photoluminescence sheet comprising particles of at least one photoluminescence material that is applied to the light emitting faces of the LED chip, and wherein the region of the wavelength conversion layer on the light emitting side faces of the LED chip adjacent to the bottom face of the LED chip extends beyond the wavelength conversion layer on the light emitting side faces of LED chips up to a distance of 20 µm. In other words the wavelength conversion layer does not have a shoulder around the bottom of the LED chip. By ensuring that there is little or no extension of the wavelength conversion layer beyond this ensures a substantially uniform color of emitted light from all faces of the device.

According to a further embodiment a white light emitting device comprises: an LED chip having a light emitting top face, light emitting side faces and bottom face; and a wavelength conversion layer of substantially uniform thickness covering the light emitting top face and light emitting side faces of the LED chip, wherein the wavelength conversion layer comprises a preformed photoluminescence sheet comprising particles of at least one photoluminescence material that is applied to the light emitting faces of the LED chip, and wherein the region of the wavelength conversion layer on the light emitting side faces of the LED chip adjacent to the bottom face of the LED chip does not extend beyond the wavelength conversion layer on the light emitting side faces of LED chip.

According to yet another embodiment a white light emitting device comprises: an LED chip having a light emitting top face, light emitting side faces and bottom face; and a wavelength conversion layer of substantially uniform thickness covering the light emitting top face and light emitting side faces of the LED chip, wherein the wavelength conversion layer comprises a preformed photoluminescence sheet comprising particles of at least one photoluminescence material that is applied to the light emitting faces of the LED chip, and wherein the wavelength conversion layer on the light emitting side faces of the LED chip tapers in thickness in region adjacent to the bottom face of the LED chip.

Other additional objects, features, and advantages of the invention are described in the detailed description, figures, and claims.

DESCRIPTION OF THE DRAWINGS

In order that the present invention is better understood a photoluminescence sheet, methods and apparatus for laminating a photoluminescence sheet (phosphor film) onto the light emitting surfaces of LED flip-chips in accordance with embodiments of the invention will now be described, by way of example only, with reference to the accompanying drawings in which like reference numerals are used to denote like parts, and in which.

DETAILED DESCRIPTION OF THE INVENTION

Various embodiments will now be described in detail with reference to the drawings, which are provided as illustrative examples of the invention so as to enable those skilled in the art to practice the invention. It will, however, be evident that various modifications and changes may be made thereto without departing from the broader spirit and scope of the invention. The specification and drawings are, accordingly, to be regarded in an illustrative rather than restrictive sense. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. An aspect or an advantage described in conjunction with a particular embodiment is not necessarily limited to that embodiment and can be practiced in any other embodiments even if not so illustrated. Also, reference throughout this specification to "some embodiments" or "other embodiments" means that a particular feature, structure, material, or characteristic described in connection with the embodiments is included in at least one embodiment. Thus, the appearances of the phrase "in some embodiment" or "in other embodiments" in various places throughout this specification are not necessarily referring to the same embodiment or embodiments. Further, various embodiments encompass present and future known equivalents to the components referred to herein by way of illustration.

Embodiments of the present invention pertain to laminating a photoluminescence sheet (phosphor film) onto the light emitting surfaces of LED chips and more particularly, though not exclusively, to applying a photoluminescence sheet onto LED flip-chips.

Phosphor Laminated LED Flip-Chip

Figure 1A:
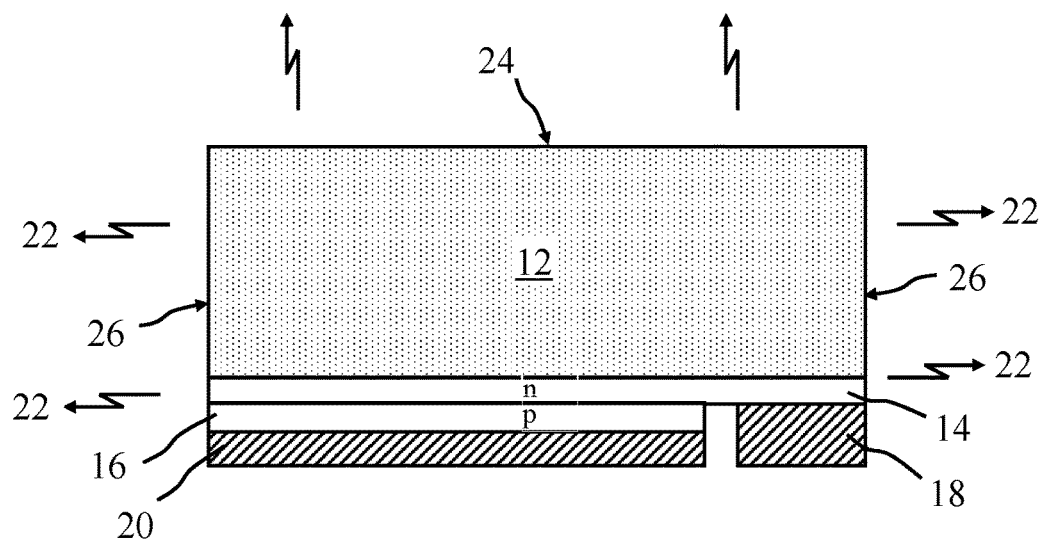
FIG. 1A is schematic representation of an LED flip-chip.

FIG. 1A is a schematic representation of a blue light emitting Ga—N (gallium nitride) based LED flip-chip 10. The LED flip-chip 10 comprises a layered structure composed of a sapphire ($Al_2O_3$) substrate layer 12, n-type and p-type Ga—N-based material layers 14, 16 and n-type and p-type electrode pads 18, 20 on a bottom face of the LED chip. It will be appreciated that the LED flip-chip shown is highly simplified and intended to be exemplary only. In practice each LED chip will comprise more complex architectures such as for example single quantum well (SQW) or multiple quantum well (MQW) structures, one or more pumping or current spreading layers, n-type and p-type cladding layers, buried electrode layers etc. In operation, and as indicated by arrows 22, the LED flip-chip 10 emits light through a light emitting top face 24 of the sapphire substrate layer 12 and from the light emitting side faces 26 of the chip. It is noted that the terms "top", "bottom" and "side" are not intended to restrict the scope of the invention to any particular orientation of the LED chip. Instead these terms are provided merely as labels to identify specific surfaces of the LED chip.

Figure 1B:
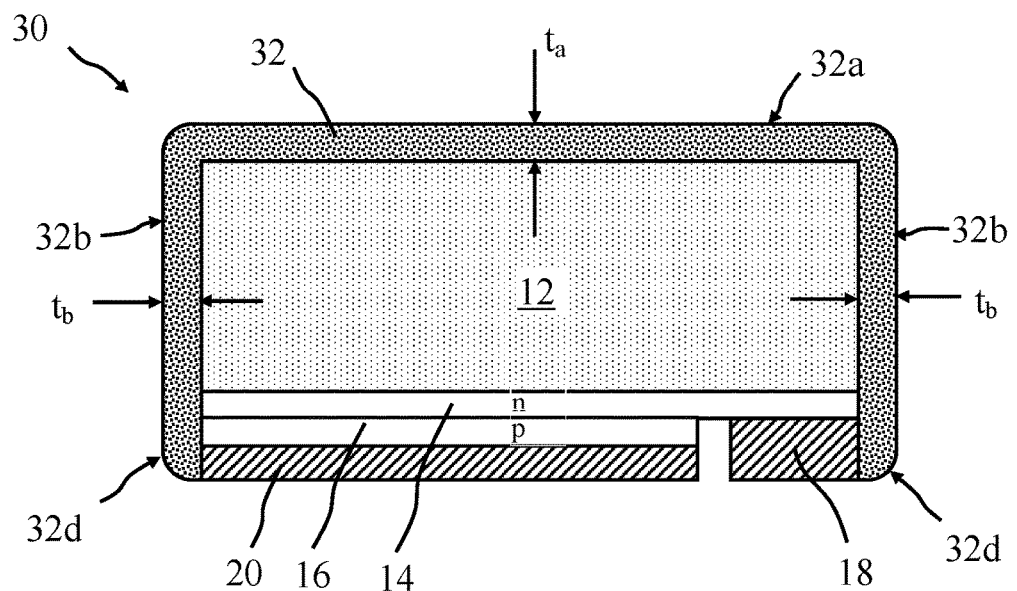
FIG. 1B is a schematic representation of a phosphor coated white LED flip-chip.

FIG. 1B is a schematic representation of white LED flip-chip 30 in accordance with an embodiment of the invention which comprises the LED flip-chip 10 of FIG. 1A with a phosphor wavelength conversion layer 32 covering the light emitting top 24 and side 26 faces of the LED flip-chip 10. The phosphor layer portion covering the light emitting top face of the LED chip (i.e. the face of the sapphire substrate 12) is designated 32a and the phosphor layer portion covering the light emitting side faces of the LED chip is designated 32b. The phosphor wavelength conversion layer comprises a preformed photoluminescence sheet comprising particles of at least one photoluminescence material that is applied to the light emitting faces of the LED chip. To ensure a uniform color of generated light from all light emitting face of the device, the thickness $t_a$ of the phosphor layer portion 32a on the light emitting top face is ideally equal to the thickness $t_b$ of the phosphor layer portions 32b on the light emitting side faces of the LED chip. Since the wavelength conversion layer 32 is applied to the LED chip in the form of a preformed photoluminescence sheet, the phosphor layer portions on the side faces will tend to be thinner in thickness than the phosphor layer portion on the light emitting top face. In some embodiments a thickness $t_b$ of the phosphor layer portions 32b on the side faces of the LED chip which are at least 95% of the thickness $t_a$ of the phosphor layer portion 32a on the light emitting top face of the LED chip.

The required thickness of the phosphor wavelength conversion layer 32 depends at least in part on the color of light that the device is intended to generate and the application in which the device is intended to be used. In embodiments where the device is intended to generate for example "cool white" light for lighting applications, the wavelength conversion layer can be of a thickness of between about 50 μm and about 70 μm. In embodiments where the device is intended to generate "warm white" light for lighting applications the wavelength conversion layer can be of a thickness between about 70 μm and about 100 μm. In embodiments where device intended to generate light with a CRI of greater than 90 CRI, the wavelength conversion layer can be of a thickness up to about 150 μm.

To ensure a uniform color of light generation from all light emitting faces of the device, the wavelength conversion layer advantageously has a variation of thickness that is typically less than about 2%. White light emitting devices according to such embodiments have been found to give a uniformity in color of generated light of less than about two MacAdam ellipses on a CIE 1931 chromaticity diagram.

As shown in FIG. 1B the phosphor layer portion 32b on the light emitting side faces of the LED flip-chip adjacent to the bottom face of the chip can have a rounded profile 32d in which the phosphor layer tapers in thickness towards the bottom face containing the electrode pads 18, 20. As is further described such a tapering in thickness can result during separation of the LED chips. In other embodiments, the region of the wavelength conversion layer on the light emitting side faces of the LED chip adjacent to the bottom face of the LED chip may extend out beyond the wavelength conversion layer on the light emitting side faces of LED chips a short distance. Preferably such an extension is less than 20 μm. By ensuring that there is little or no extension of the wavelength conversion layer beyond this ensures a substantially uniform color of emitted light from all faces of the device.

Methods in accordance with embodiments of the invention will be described in relation to the manufacture of white LED flip-chips and in particular the application of a phosphor layer to LED flip-chips.

LED Flip-Chip Phosphor Laminating Apparatus

Figure 2:
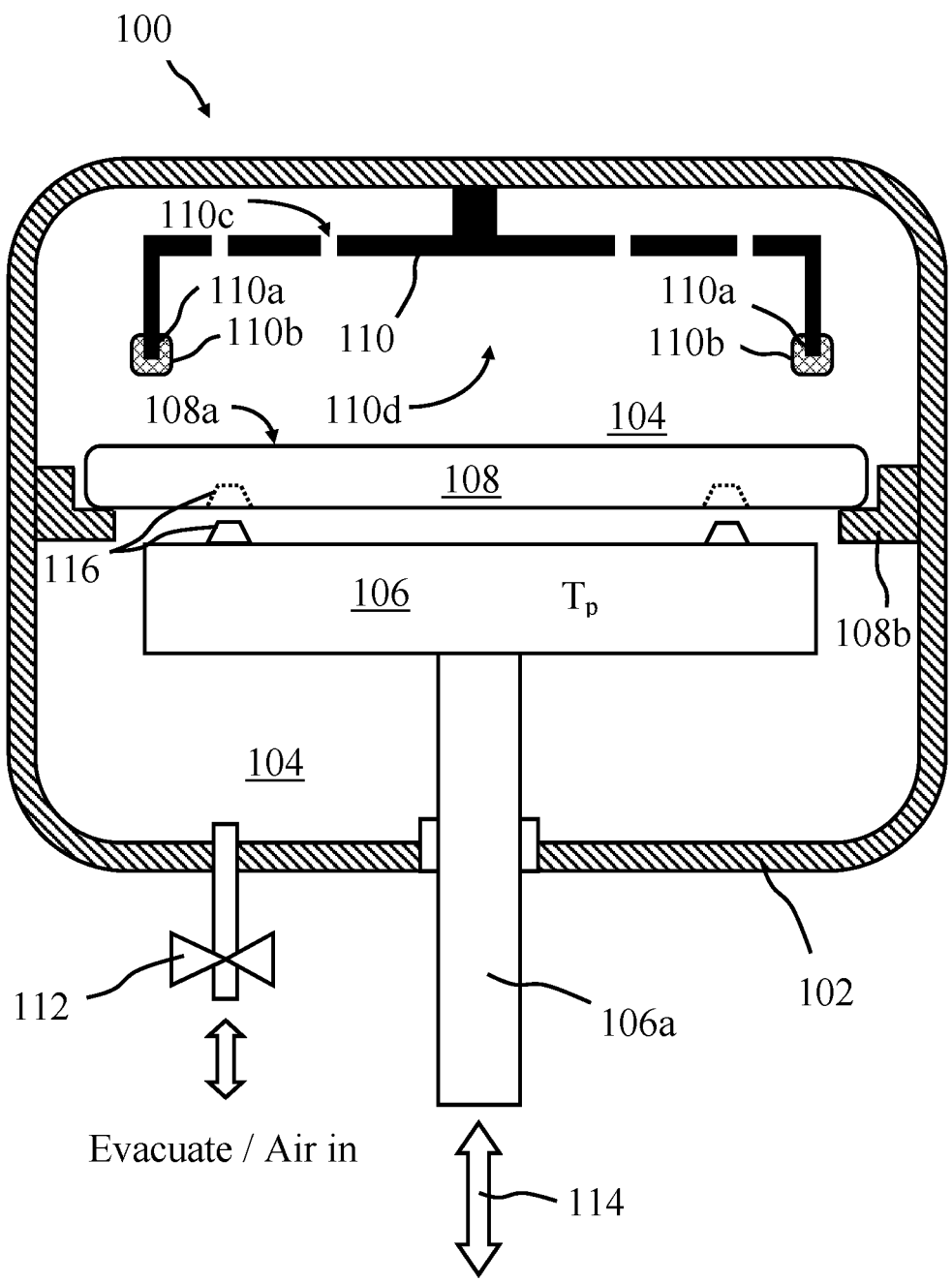
FIG. 2 shows a sectional schematic of a phosphor laminating apparatus in accordance with an embodiment of the invention for applying a phosphor layer to LED flip-chips.

FIG. 2 is a sectional schematic of a phosphor laminating apparatus 100 in accordance with an embodiment of the invention for applying a phosphor layer to LED flip-chips. The laminating apparatus 100 comprises a vacuum chamber 102 that houses within its interior 104: a moveable temperature controllable platform (platform) 106; a removable, moveable thermally conductive work support (work support) 108; and a fixed edger sealer (edge sealer) 110. One or more valves 112 enable the introduction of air and/or evacuation of the interior 104 of the vacuum chamber 102. The apparatus further comprises a door (not shown) to enable access to the interior 104 of the vacuum chamber and facilitate insertion and/or removal of the work support 108, LED flip-chips, phosphor film etc. An actuating rod 106a attached to the underside of the platform 106 passes through a gas tight seal in the base of the vacuum chamber 102 and is moveable in an upward/downward direction as indicated in FIG. 2 by arrow 114. Movement of the actuating rod 106a moves the platform 106 in an upward/downward direction 114. The temperature controllable platform 106 can be both heated or cooled and has a platform temperature $T_p$.

Figure 3A:
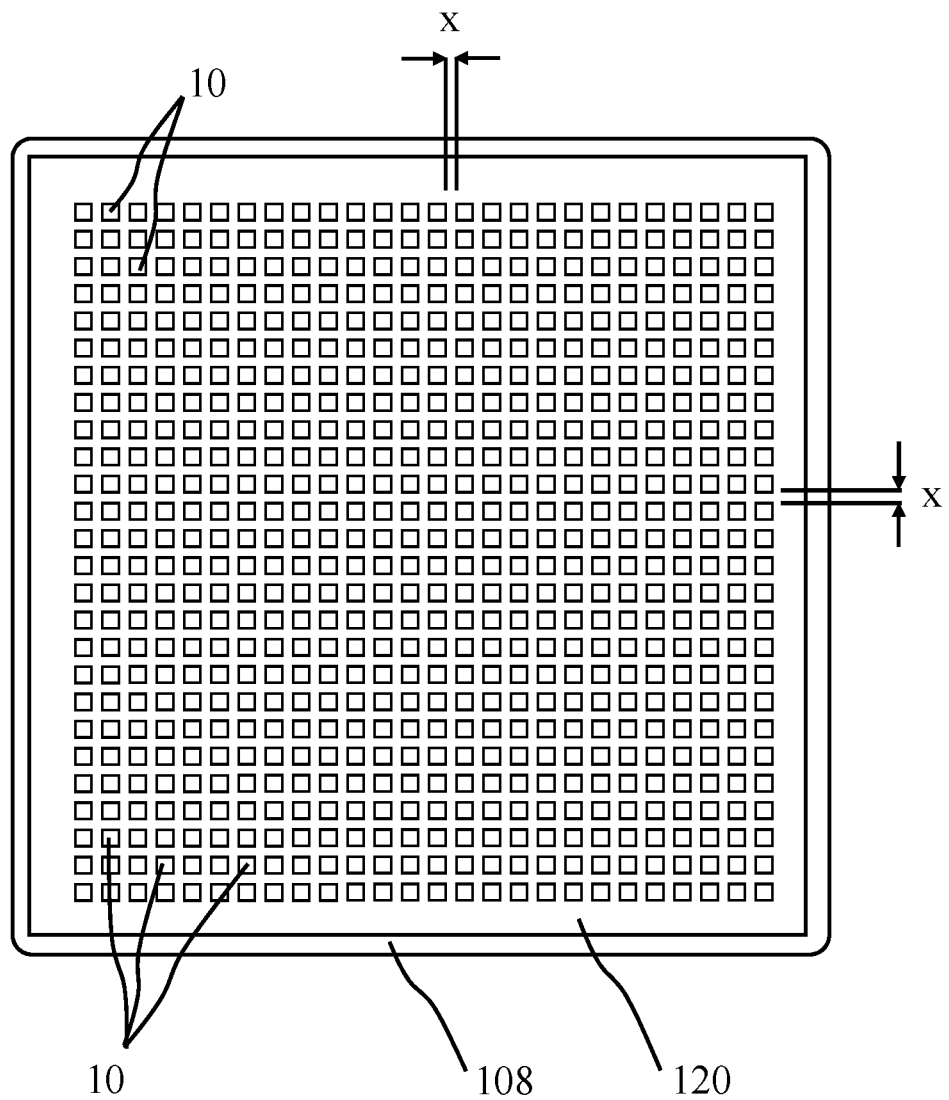
FIGS. 3A to 3K are schematic representations of a method in accordance with an embodiment of the invention of laminating a phosphor film onto an LED flip-chips utilizing the phosphor laminating apparatus of FIG. 2.
Figure 3B:
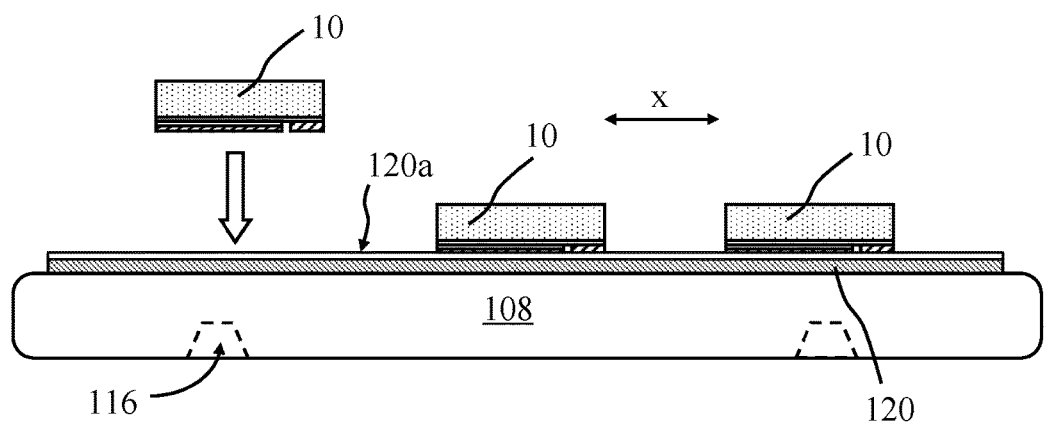
Figure 3C:
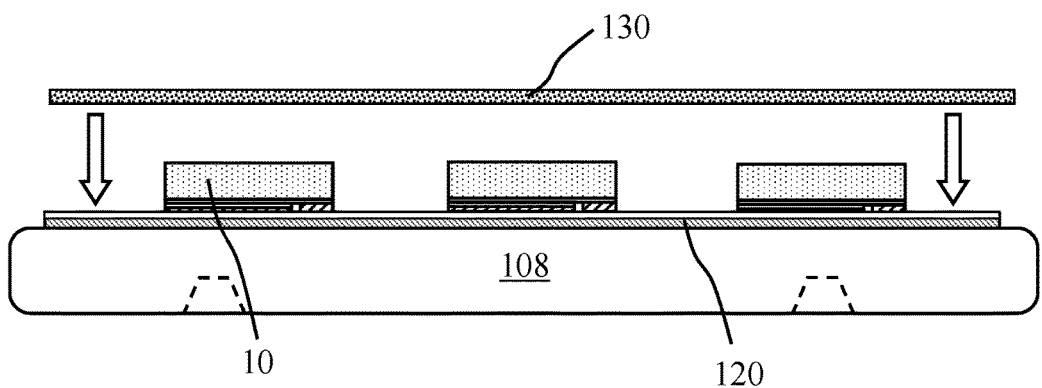
Figure 3D:
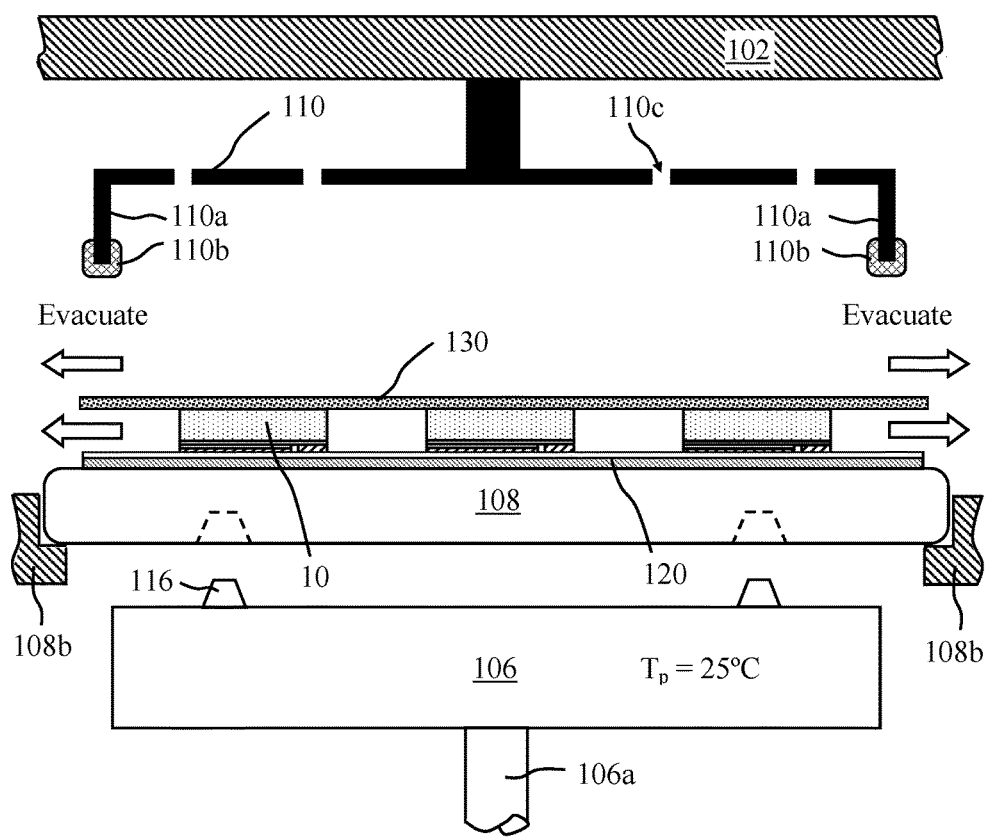
Figure 3E:
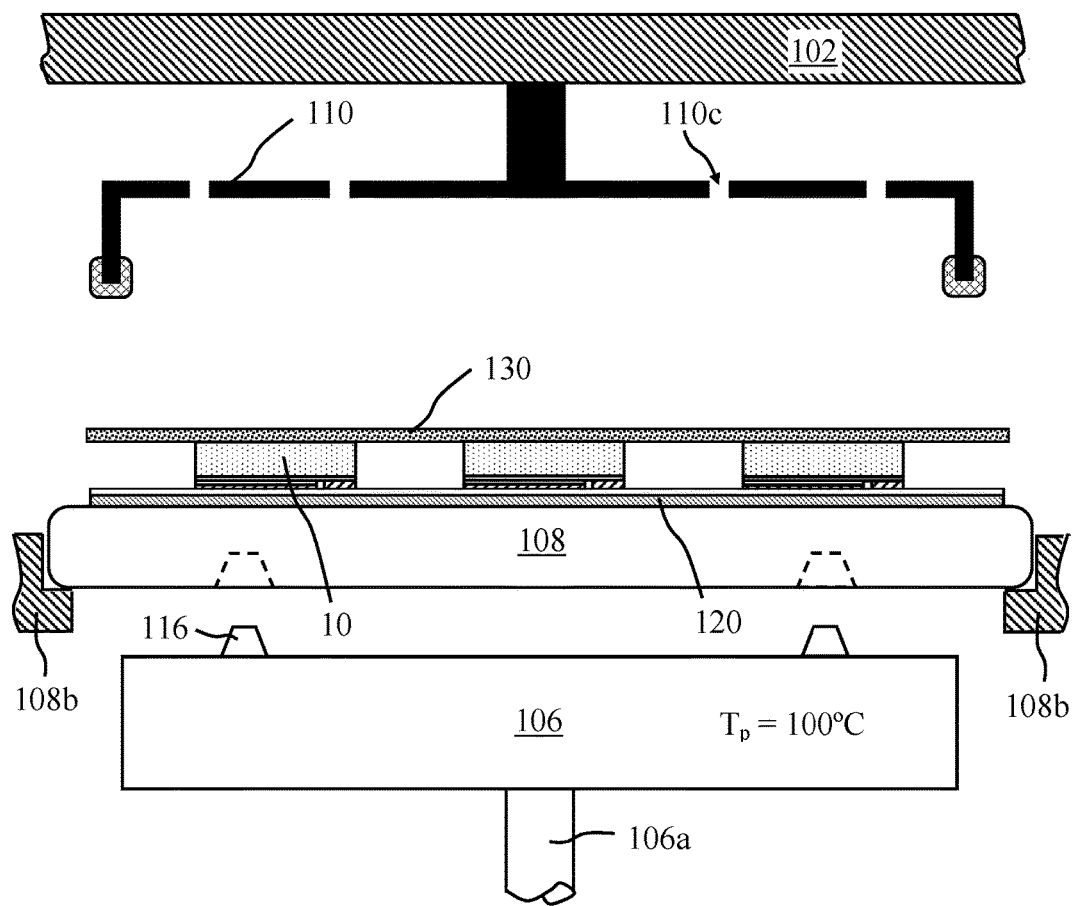
Figure 3F:
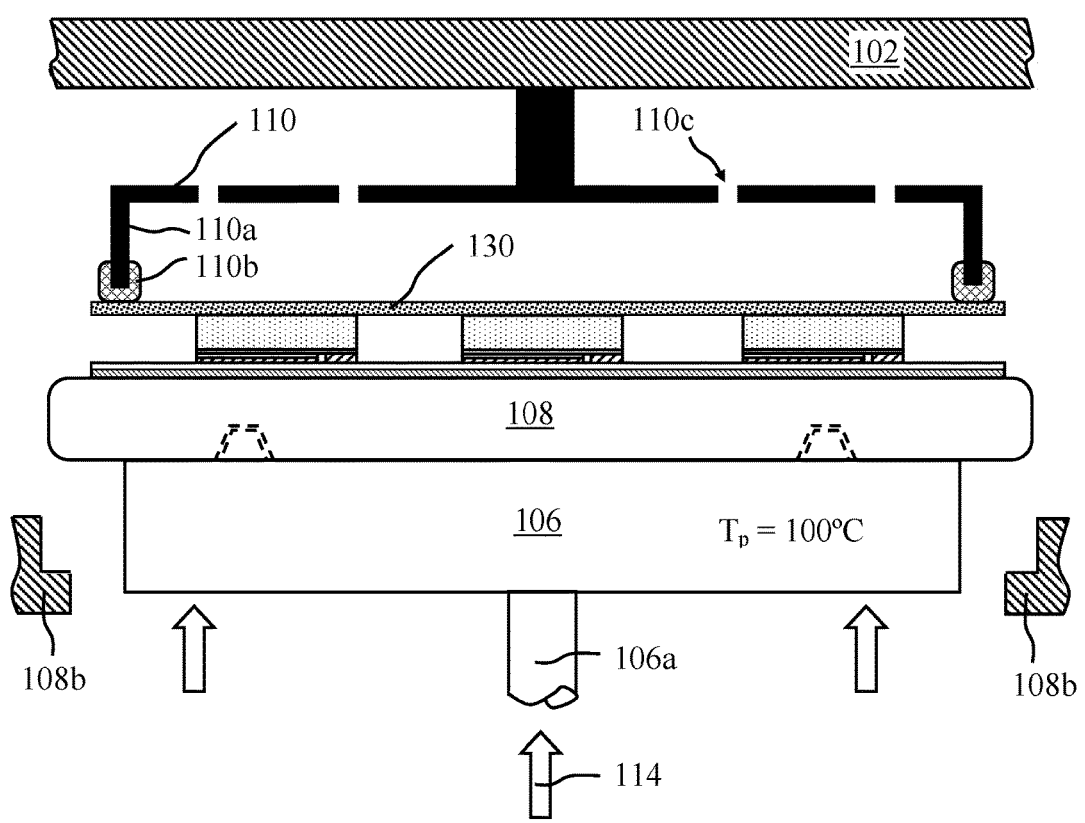
Figure 3G:
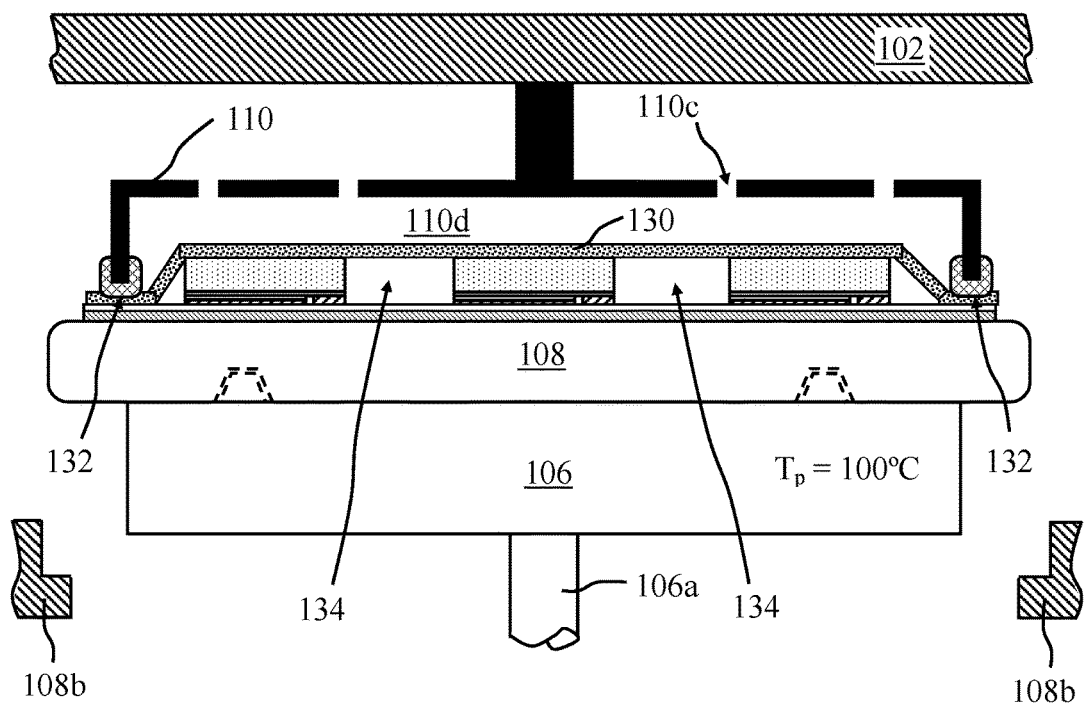

The edge sealer 110 is fixed to the ceiling of the vacuum chamber 102 and comprises a peripheral sealing edge 110a which faces the upper surface of the work support 108. Typically the edge sealer 110 is composed of aluminum or steel and can have a coating of PTFE (Polytetrafluoroethylene) on at least the surfaces of the edge sealer that will, in operation, come into contact with a phosphor film. As shown in FIG. 2 the edge sealer 110 can further comprise a resiliently deformable edge cushion 110b around the sealing edge 110a to assist in ensuring a gas tight seal in operation. The edge cushion 110b can comprise a high temperature silicone. One or more through holes/passages 110c are provided in the upper surface of the edge sealer 110 to enable the passage of air, or other gases, between the interior 104 of the vacuum chamber and the interior volume 110d defined by the edge sealer 110 in conjunction with the work support 108 (FIG. 3G).

The work support 108 can comprise any thermally conductive material such as, for example, aluminum or stainless steel and comprises a planar upper surface 108a for receiving LED flip-chips and a phosphor film. Edges of the work support 108 rest on, and are supported by, a work support holder (holder) 108b on the interior side wall of the vacuum chamber 102.

As shown in FIG. 2, when the platform 106 is retracted to its lowest position the upper surface of the platform 106 is separated from the underside of the work support 108 which rests in the holder 108b. Moreover, in this position the upper surface of the work support 108 and sealing edge 110a are in a spaced (separated) relationship. Movement of the platform 104 in an upward direction (i.e. in a direction towards the ceiling of the vacuum chamber) will eventually result in the upper surface of the platform 106 contacting with the underside of the work support 108. As indicated in FIG. 2 the platform 106 and work support 108 can comprise cooperating alignment features 116, such as a peg and hole arrangement, to maintain correct alignment of the platform and support during phosphor lamination. Further upward movement of the platform 104 will lift the work support 108 out of the holder 108b and move the work support 108 in an upward direction towards the ceiling of the vacuum chamber. With continued upward movement the upper surface of the work support 108 will eventually come into contact with the sealing edge 110a of the edge sealer 110 (FIG. 3E). It will be appreciated that the apparatus 100 enables relative movement of the work support, platform and edge sealer. In other embodiments the edge sealer can be movable and the platform fixed or both movable to effect relative movement of the components.

Phosphor Film

A phosphor film according to embodiments of the invention comprises a sheet of UV-curable light transmissive polymer material which has one or more phosphors, or other photoluminescence materials (e.g. quantum dots) incorporated in and homogeneously distributed throughout the volume of the polymer material. The polymer material is partially cured such as to form a solid sheet. In this patent specification partially cured is used to denote that the polymer is not fully cross-linked to form long-chain polymers. In embodiments of the invention the polymer material is cured to a point such that the phosphor film comprises a solid flexible sheet that can be worked without the aid of an additional support substrate such as a backing sheet. In some embodiments the polymer is cured to about 10% or less of full curing. In this specification the polymer material will be referred to as a B-stage cure material. In addition to the polymer being UV-curable and partially cured, the polymer material is further thermally re-flowable before final UV (ultraviolet) curing, that is it has a thermoplastic property. For example before curing, at room temperature (about 25° C. to 30° C.) the phosphor film is tacky and will soften at its temperature is increased. At about 100° C. the phosphor film will soften and become stretchable and gel like. At about 160° C. the polymer will begin to flow.

The polymer can comprise an epoxy resin or a silicone material. Examples of such polymers comprise UV curable urethane acrylate, acrylic acrylate and epoxy acrylate resins such as for example HA7927-15 and HA7927 resins available from Hitachi Chemical Co America of San Jose, Calif., USA (http://www.hitachi-chem.co.jp/english/products/aprm/020.html, last accessed 24 Feb. 2016).

Typically the phosphor film is of thickness 50 μm to 100 μm with a phosphor weight loading of about 40% to 70% depending on the intended CCT (Correlated Color Temperature) that the phosphor film is intended to generate. Typically the phosphor particles have a D50 particles size of between about 8 μm and about 15 μm. The phosphor film can be manufactured by thoroughly mixing the phosphor, which is typically in the form of particles, with the liquid polymer material to form a slurry and then slot-die coating the slurry as layer of uniform thickness onto a PTFE (polytetrafluoroethylene) release film. The deposited film is then partially cured (B-staged) by exposing the deposited film to ultra violet light to form a solid workable film.

Method of Phosphor Coating LED Flip-Chips

A method of applying a phosphor coating layer (e.g. phosphor film) onto LED flip-chips utilizing the phosphor laminating apparatus of FIG. 2 is now described with reference to FIGS. 3A to 3K.

Step 1: Attachment of LED Chips to a Thermal Releasable Sheet (FIGS. 3A and 3B)

A plurality of LED flip-chips 10 are arranged in a known configuration and attached by their lower face having the electrode contacts 18, 20 to the adhesive face 120*a* of a thermal releasable adhesive sheet (adhesive sheet) 120. Typically, the LED flip-chips 10 are configured on the adhesive sheet as a square array with a separation x between LED chips 10 of typically between about 0.5 mm and 1 mm (FIG. 3A). For the sake of clarity only a 3×3 array is indicated in the figures, though it will be appreciated that in practice the array will typically comprise many hundreds or even thousands of LED flip-chips.

As is known thermal release sheets and tapes are used for electronic component processing and typically comprises a polymer film, such as polyester, with a layer of thermal (heat) releasable adhesive on one or both faces. The thermal releasable adhesive 120*a* firmly adheres to such components at temperatures below a release temperature $T_r$ and readily releases once the adhesive sheet is heated to the release temperature $T_r$. Such a tape is a single use product that once heated to its release temperature irreversibly loses its adhesive properties. An example of a suitable adhesive sheet is Nitto Denko's REVALPHA Thermal Release Tape with a release temperature $T_r$ of 150° C.

The adhesive sheet 120 carrying the array of LED chips 10 can be fastened to the planar surface 108*a* of the work support 108 using an adhesive tape. Alternatively, in other embodiments a double sided thermally releasable adhesive sheet can be used to attach the sheet directly to the planar surface 108*a* of the work support. Other attachment arrangements can be used to attach the adhesive sheet 120 to the work support 108.

Step 2: Application of Phosphor Film (FIG. 3C)

A phosphor film 130 is laid over the array of LED flip-chips in contact with the LED flip-chips light emitting top face 24 and lightly adheres to the LED chips.

Step 3: Evacuation of Air (FIG. 3D)

The work support 108 carrying the adhesive sheet 120, LED flip-chips 10 and phosphor film 130 is inserted into the vacuum chamber 102 in the holder 108*b*. The vacuum chamber is then evacuated to remove the air.

Step 4: Conforming Phosphor Film to LED Chips (FIGS. 3E to 3K)

The platform 106 is heated to a temperature that is sufficiently high to cause softening of the phosphor film 130 but below the release temperature $T_r$ of the adhesive sheet 120 (FIG. 3E), typically around 100° C. The platform 106 is then moved upward to engage the work support 108 and heat the work support. In other embodiments the platform 106 can be raised such as to be in thermal communication with the work support 108 and then heated. Once the work support 108 has heated and the phosphor film has softened, the platform 106 is raised lifting the work support out of the holder 108*a* (FIG. 3F) and raised until the sealing edge 110*a* of the edge sealer 110 urges the periphery of the phosphor film 130 into contact with the adhesive sheet 120 (FIG. 3G). As shown in FIG. 3G the peripheral edge 132 of the phosphor film 130 adheres to the adhesive sheet 120 to form a continuous closed peripheral seal such that the adhesive sheet and phosphor film define a gas tight pocket 134 containing the array of LED flip-chips.

Figure 3H:
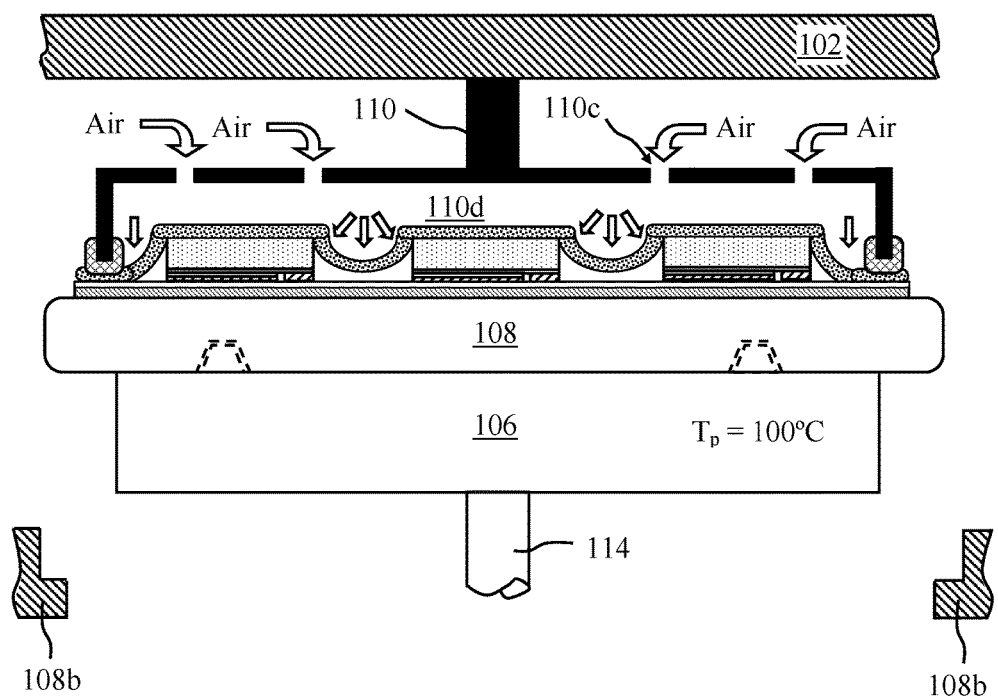
Figure 3I:
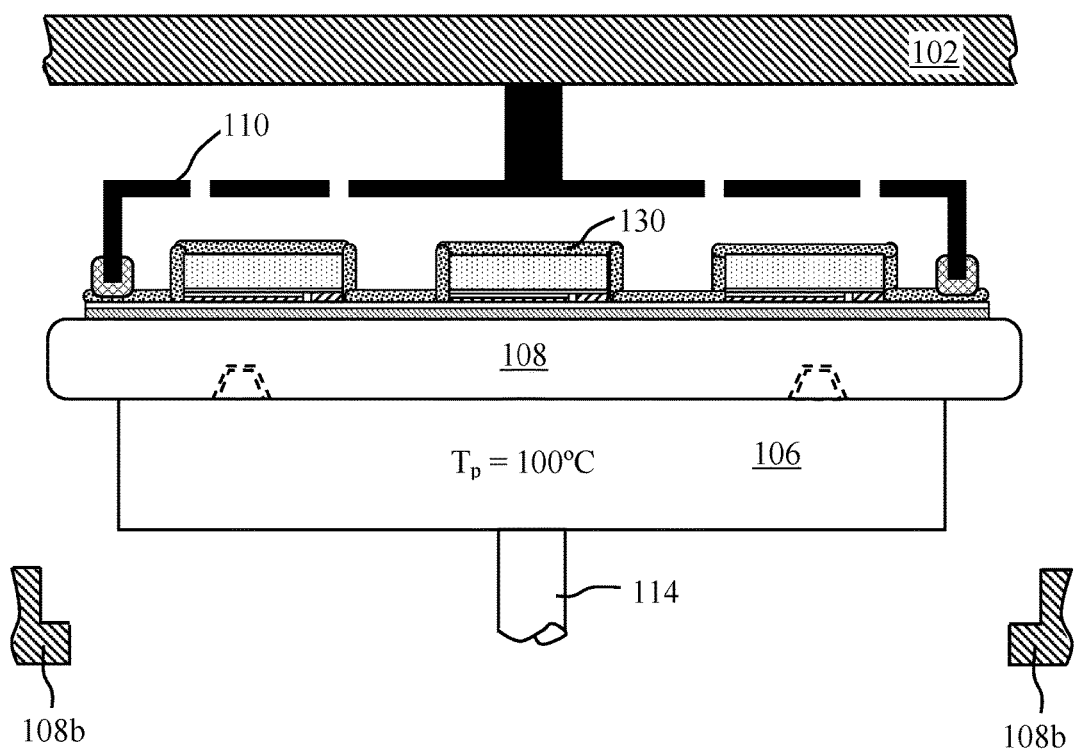
Figure 3J:
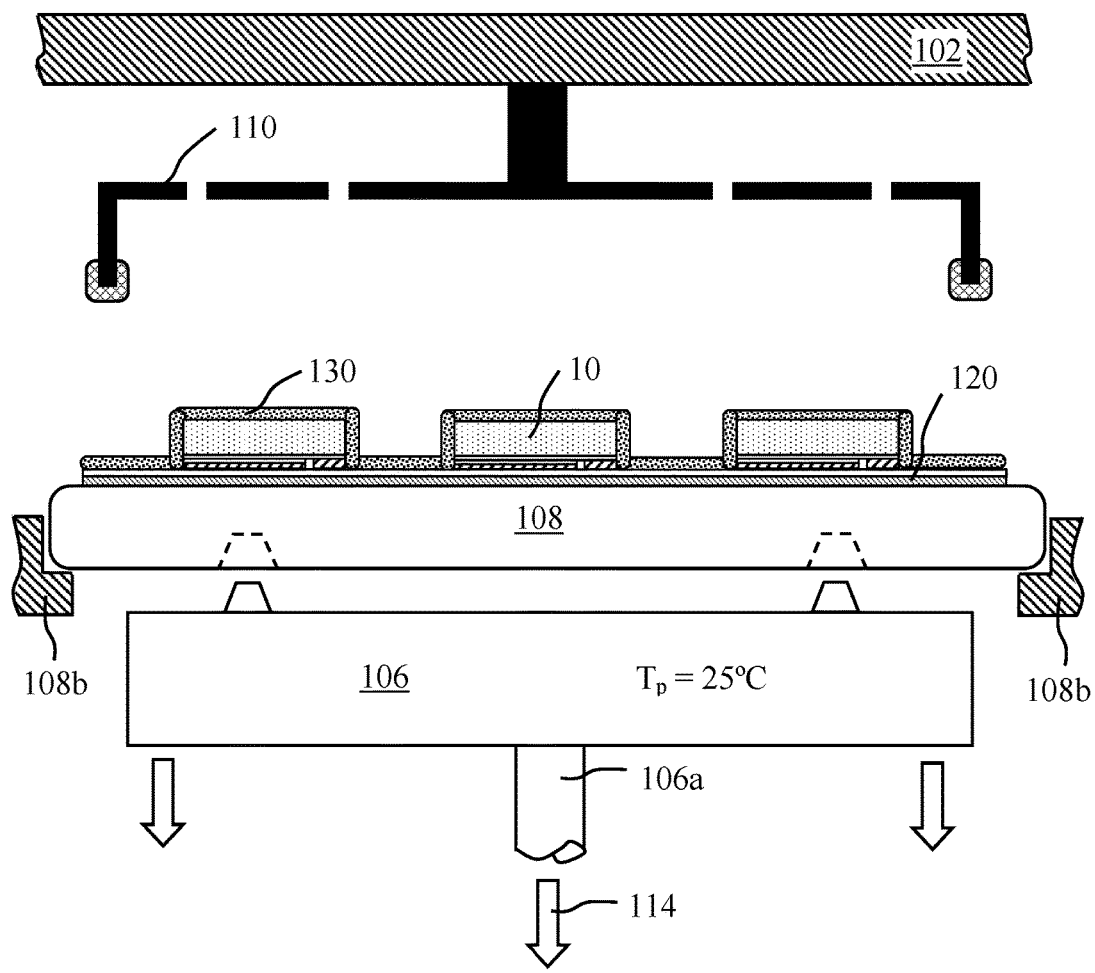

Next, as shown in FIG. 3H air, or other gas, is introduced into the vacuum chamber 102. The air passes through the holes 110*c* in the upper surface of the edge sealer 110 into the volume 110*d* applying hydrostatic pressure to the surface of the phosphor film 130 and thereby conforming the phosphor film 130 over the LED flip-chips light emitting top 24 and side faces 26 (FIG. 3I). The work support 108 and platform 106 are cooled to room temperature $T_p$=25° C. and once cooled, the platform 106 lowered such that the work support 108 rests in the holder 108*a* (FIG. 3J).

Figure 3K:
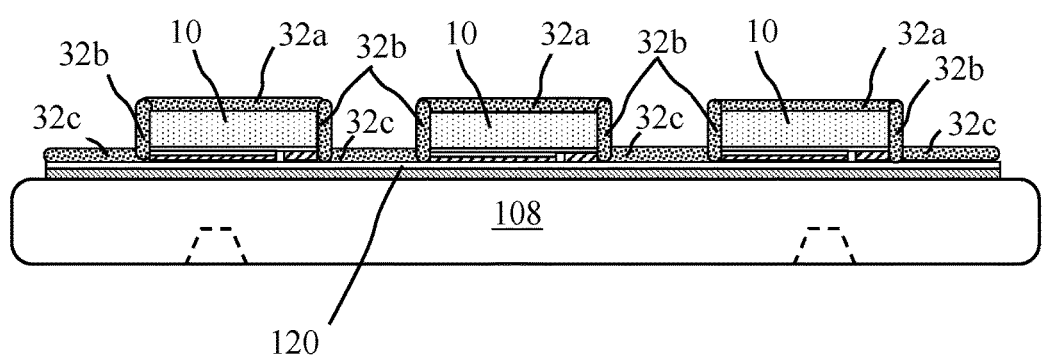

Step 5: Removal of Phosphor Coated Chips (FIG. 3K)

The work support 108 together with the adhesive sheet, LED chips and phosphor film are removed from the apparatus 100. As shown in FIG. 3K each LED flip-chip 10 has a conformal phosphor layer 32 over its light emitting top face 24 and side faces 26. It should be noted that the phosphor film is still in a partially cured (B-stage cure) state and is consequently thermally re-flowable (softenable).

Methods of Separating Phosphor Coated LED Flip-Chips

Two example methods of separating the phosphor coated LED flip-chips in accordance with embodiments of the invention are now described with reference to FIGS. 4A to 4L and FIGS. 5A to 5F respectively. Separation of the phosphor coated LED flip-chips can, as described, be carried out with the adhesive sheet carrying the plurality of phosphor coated LED flip-chips mounted on the work support 108 or processing carried out using another suitable support surface.

Method 1 of Separating Phosphor Coated LED Flip-Chips

A first method in accordance with an embodiment of the invention of separating the phosphor coated LED flip-chips from the adhesive sheet is now described with reference to FIGS. 4A to 4L.

Step 1: Selective U.V. Curing of Phosphor Layer (FIGS. 4A and 4B)

Figure 4A:
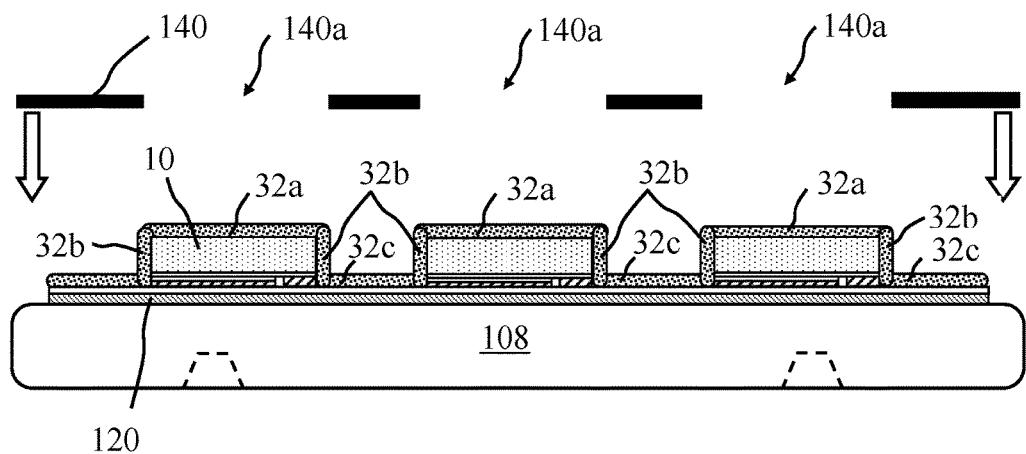
FIGS. 4A to 4L are schematic representations of a method in accordance with an embodiment of the invention for separating phosphor coated LED-flip chips.
Figure 4B:
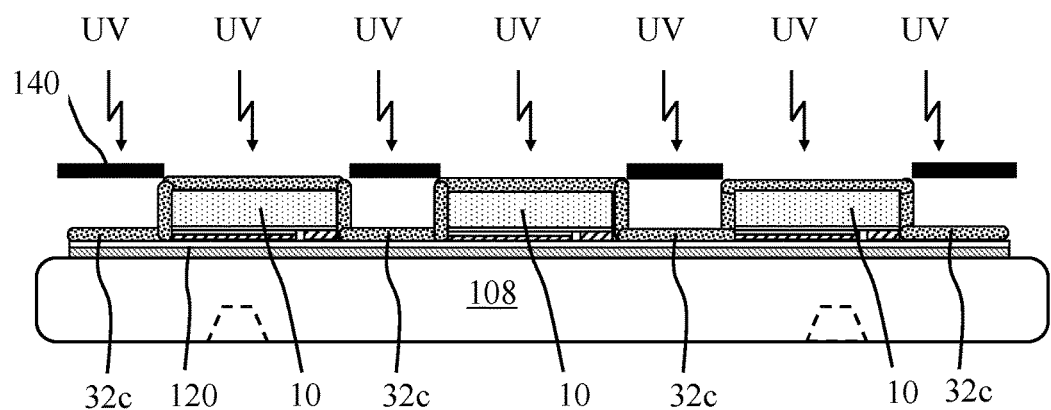

A UV opaque mask 140 is aligned over the array of LED flips-chips with a respective opening (UV transmissive window) 140*a* overlaying an associated LED flip-chip (FIG. 4A). Typically the LED flip-chips 10 are square or rectangular in form and the mask openings 140*a* are correspondingly shaped. The assembly is exposed to U.V. light to selectively cure of phosphor layer portion 32*a* on the light emitting top face 24 of LED flip chips (FIG. 4B). The mask openings 140*a* are configured such that when the assembly is exposed to UV light only the phosphor layer portion 32*a* on the light emitting top face 24 of LED flip-chip is cured. The mask 140 is configured to prevent UV light reaching and curing the phosphor layer portion 32*b* on the light emitting side faces 26 of the LED chips and the phosphor layer portions (waste phosphor portions) 32*c* between the LED flip-chips. It will be appreciated that the waste phosphor layer portions 32*c* and the phosphor layer portion 32*b* remain in a partially cured (B-stage) after exposure to UV light.

Step 2: Attachment of UV Releasable Adhesive Sheet to Phosphor Coated LED Chips (FIG. 4C to 4F)

Figure 4C:
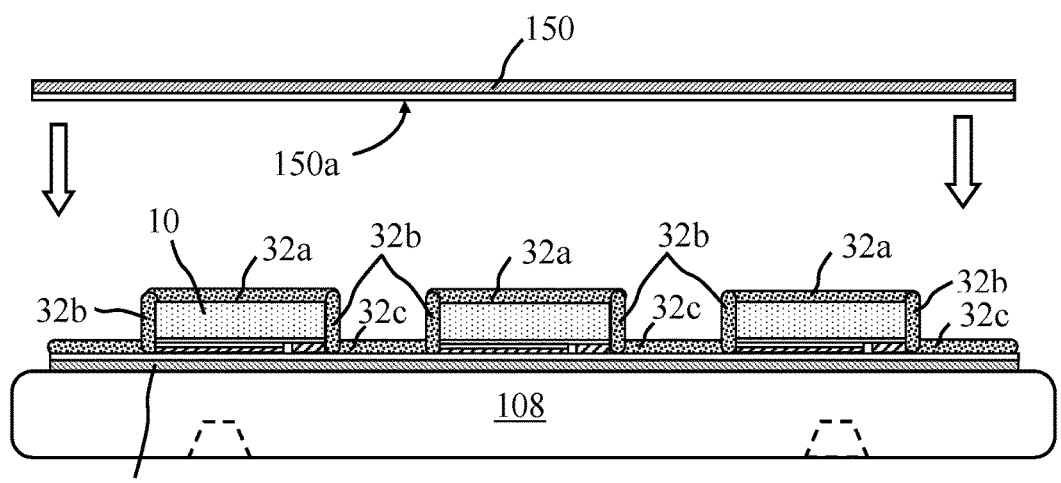
Figure 4D:
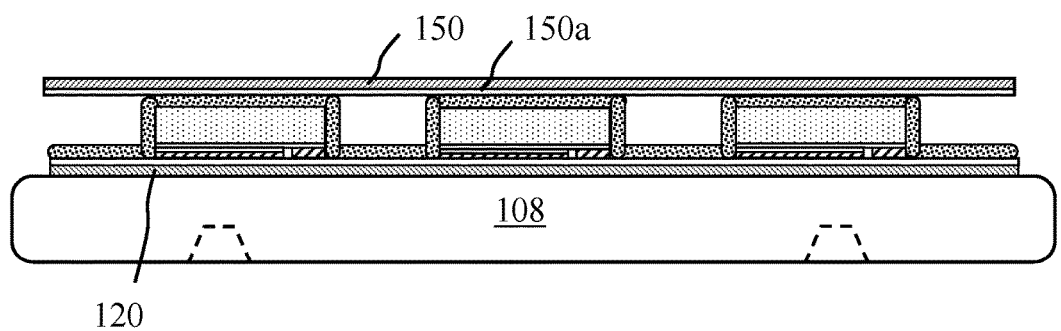

A UV releasable adhesive sheet (UV adhesive sheet) 150 is adhered to the phosphor layer portions 32*a* covering the light emitting top face 24 of the LED chips 10 (FIGS. 4C and 4D). UV releasable adhesive sheets and tapes are used for electronic component processing and comprise a polymer film, such as PET (Polyethylene terephthalate), with a layer of UV releasable adhesive on one or both faces. The UV releasable adhesive 150*a* adheres before exposure to UV light and is peelable once the adhesive sheet is exposed to UV light. An example of a suitable adhesive sheet is Lintec Corporation's ADWILL E series UV curable back grinding tape.

Figure 4E:
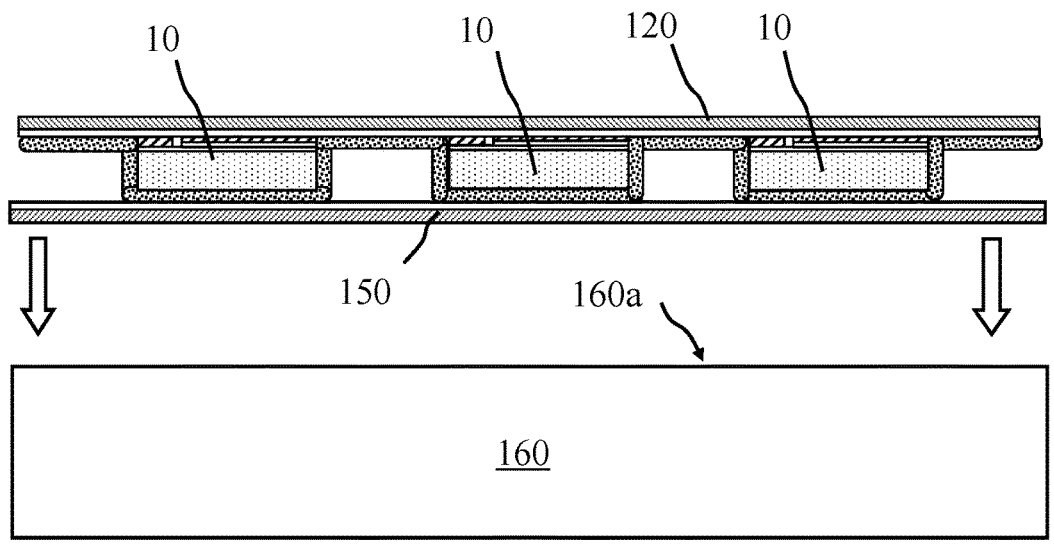
Figure 4F:
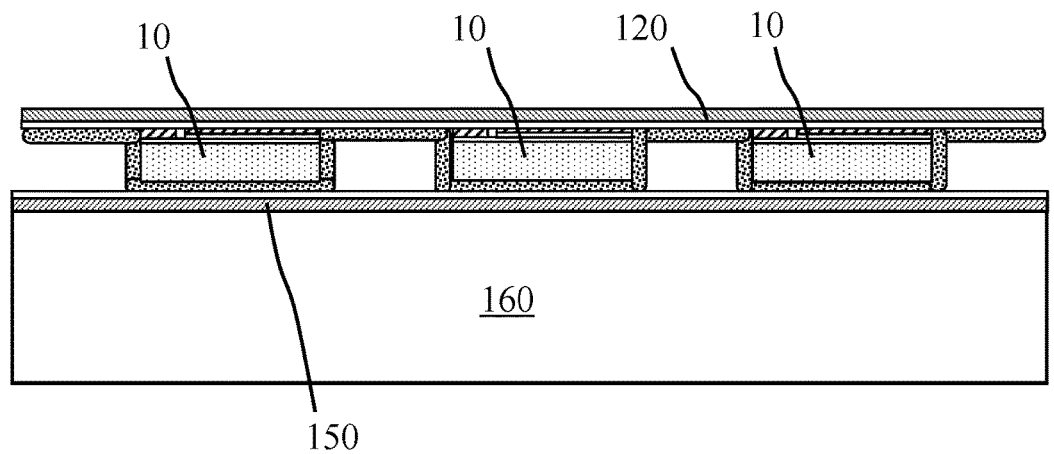

The layered assembly comprising the adhesive sheet 120, array of phosphor coated 32 LED chips 10 and UV adhesive sheet 150, is removed from work platform 108 turned over and fastened to the planar surface 160*a* of a support structure (e.g. table) 160 with the UV adhesive sheet 150 in contact with the table 160 (FIGS. 4E and 4F). The UV adhesive sheet 150 can be attached to the table 160 using adhesive tape or can be directly attached when using a double sided UV adhesive sheet. The purpose of the UV adhesive sheet 150 is to detachably secure the array of LED chips 10 by means of the phosphor layer portion 32a to the table 160. The table 160 can be UV transmissive to facilitate removal of the finished white LEDs 32 from the UV adhesive sheet by exposing the rear of the UV adhesive sheet to UV light (FIG. 4K). In alternative embodiments the array of phosphor coated LED chips 30 can be detachably secured to the table 160 by the phosphor layer portion 32a using for example a thermoplastic sheet (i.e. adheres when heated and loses it adhesion when cooled) or a thermal releasable adhesive sheet. In such arrangements the table 160 comprises a heated and/or cooled arrangement. In yet other embodiments the table 160 can comprise a vacuum table for detachably securing the array of coated LED chips to the work surface of the table.

Step 3: Separation of Phosphor Coated LED Flip-Chips (FIG. 4G to 4I)

Figure 4G:
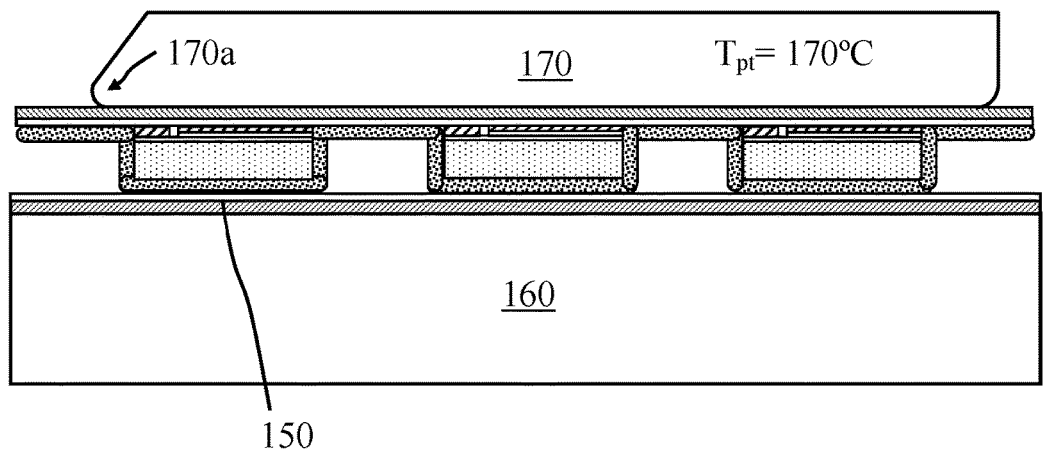

A moveable heated plate (plate) 170 is positioned on top of the adhesive sheet 120 (FIG. 4G). The adhesive sheet 120 is not attached to the plate 170. The plate has rounded edges 170a and can, as indicated in FIG. 4H, slide relative to the table 160 in a horizontal direction indicated by arrow 170b. To reduce friction between the plate 170 and adhesive sheet 120, the face and edges of the plate coming into contact with the adhesive sheet can comprise a friction reducing material such as PTFE.

The plate 170 is heated to a temperature $T_{pt}$ (about 170° C.) that is above the release temperature $T_r$ of the adhesive sheet 120 and sufficiently high to cause flow of the uncured portions of the phosphor layer (i.e. the waste phosphor layer portions 32c and phosphor layer portions 32b). Whilst the adhesive sheet 120 readily releases from rigid surfaces such as metallic or semiconductor material surfaces (e.g. LED flip-chips) it does not readily release from deformable material such as the phosphor film which is composed of silicone. The difficulty in releasing the phosphor layer from the adhesive sheet is further complicated by the phosphor layer being vacuum conformed to the adhesive sheet (FIGS. 3H and 3I). Moreover, it is found that the phosphor layer 32c does not readily release from the adhesive sheet even when the phosphor film is fully cured.

Figure 4H:
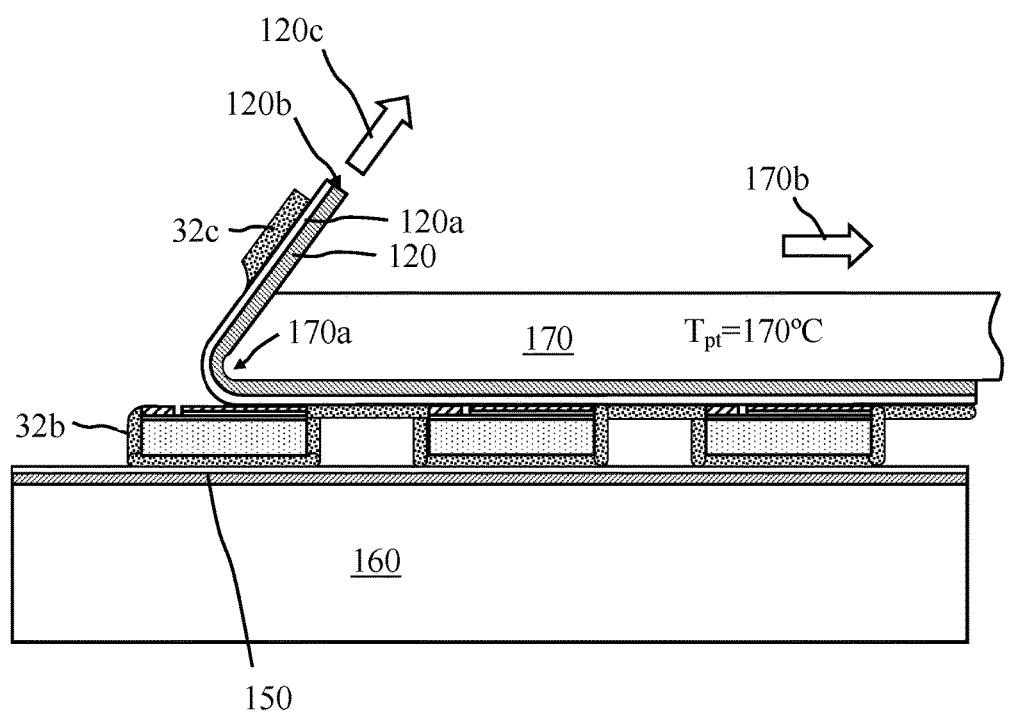
Figure 4I:
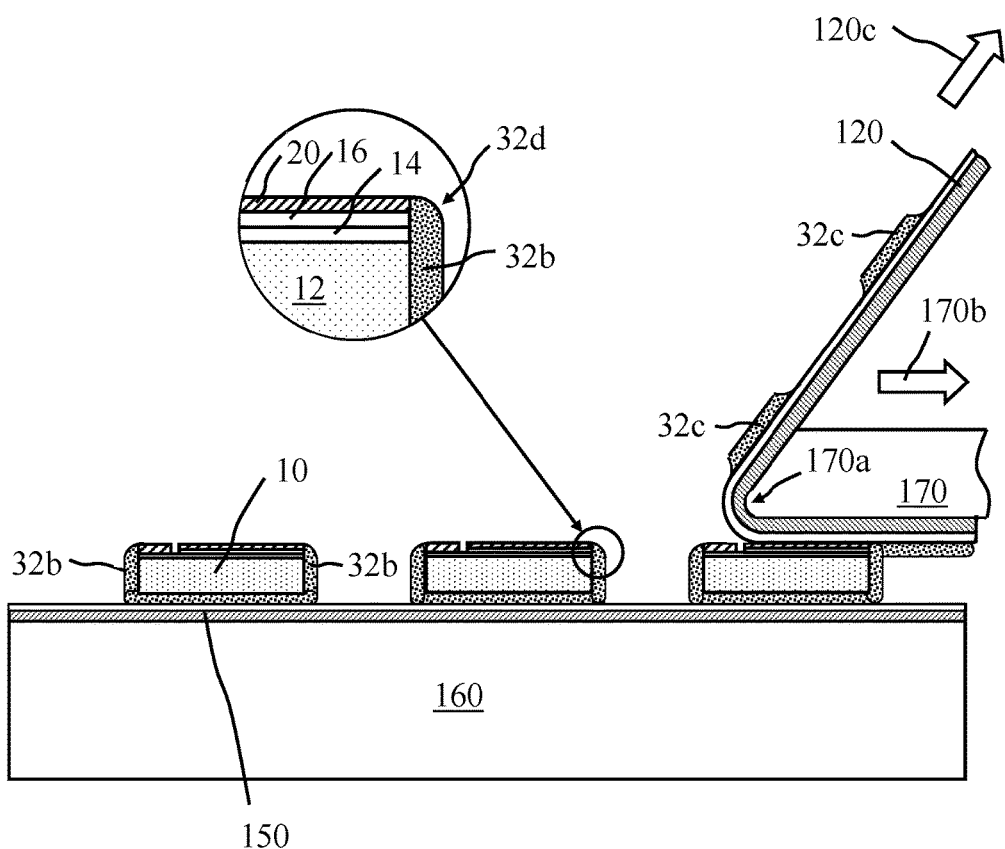

Once the adhesive sheet 120 has been heated above its release temperature $T_r$ and the uncured phosphor layer portions 32b, 32c are softened, one edge 120b of the adhesive sheet 120 is drawn over the rounded edge 170a of the plate 170 in a direction 120c that is upward and over the plate 170 towards the opposite edge of the adhesive sheet (FIGS. 4H and 4I). As indicated, the operation of peeling the adhesive sheet 120 moves the plate in the direction 120c and separates the adhesive sheet from the LED-flip chips. The weight of the plate helps to ensure clean removal of the waste phosphor layer portions 32c which remain attached to the adhesive sheet 120. The uncured phosphor layer portions 32b, 32c are heated to a temperature at which they soften and begin to flow to facilitate separation of the phosphor layer portions at their junction. As shown in the enlarged portion of FIG. 4I and as a result of the separation process the phosphor layer portion 32b covering the side faces of the LED flip-chip adjacent to the bottom face of the chip can have a rounded profile 32d in which the phosphor layer tapers in thickness towards the bottom face comprising the electrodes. Such a rounding 32d can result in a thinning of the phosphor layer portion 32b covering the LED junction (junction of n and p-type layers 14, 16 FIG. 1A) which can lead to a slight difference in color of emitted light from the edges of the phosphor coated LED flip-chips. To reduce the variation in the thickness of the phosphor layer portion covering the junction it is proposed to use thicker electrodes 18, 20 on the LED-flip-chips, such as solder balls, such that any thinning of the phosphor layer, which originates at the base of the electrodes, is minimized at the LED junction. Alternatively, when the device is mounted on a substrate such as a circuit board, a light reflective material can be deposited, by for example inkjet printing, around the peripheral edge of the device.

Step 4: Final Curing of Phosphor Layer (FIG. 4J)

Figure 4J:
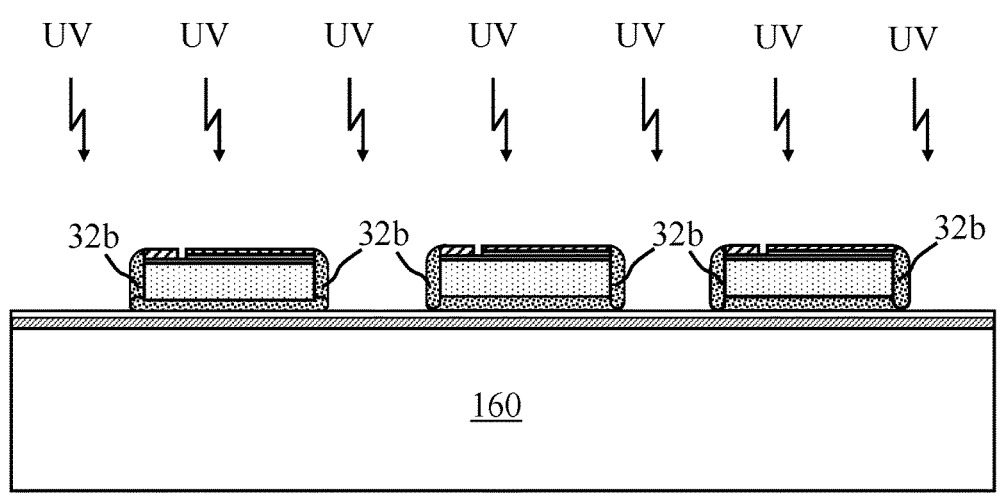
Figure 4K:
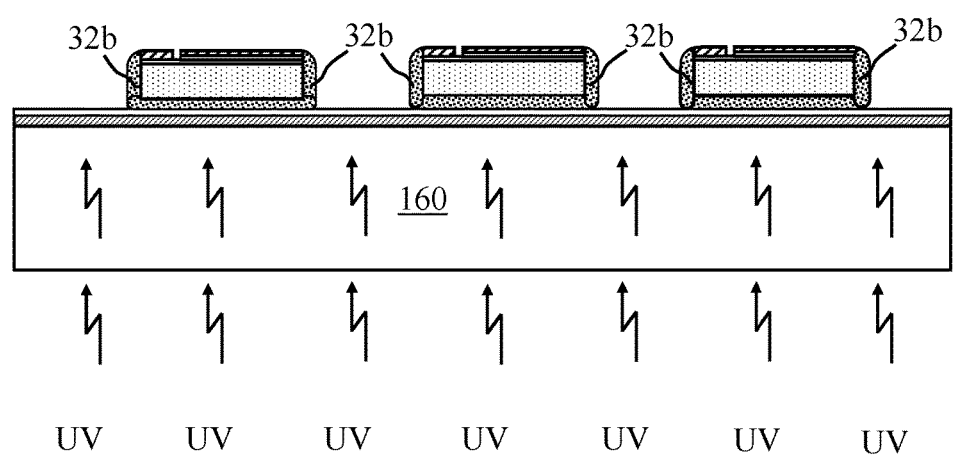

Optionally the uncured phosphor layer portions 32b covering the light emitting edges of the LED flip-chips is cured by exposing the array of LED flip-chips to UV light (FIG. 4J).

Figure 4L:
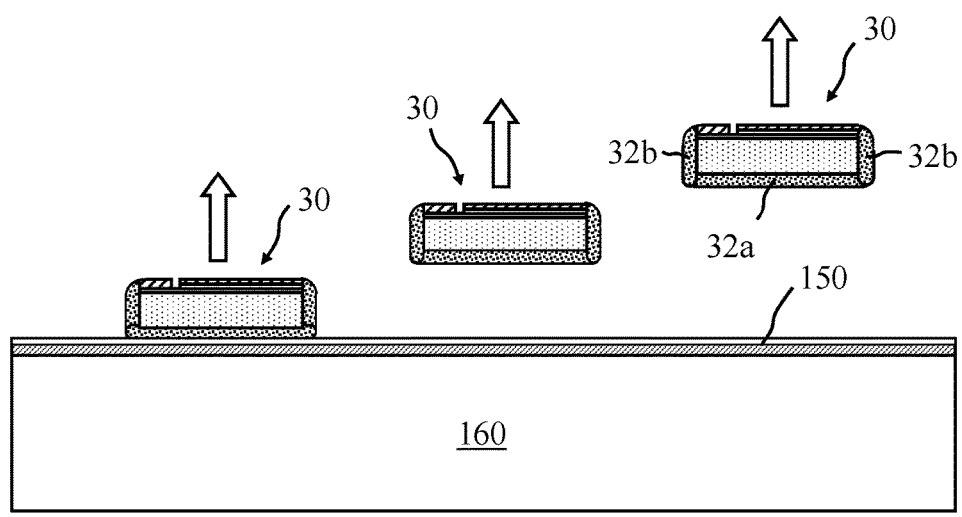

Step 5: Removal of Phosphor Coated LED Flip-Chips (FIGS. 4K and 4L)

To release the phosphor coated LED flip-chips 30 from the UV adhesive sheet 150 the underside face of the UV adhesive sheet 150 is exposed to UV light (FIG. 4K). As indicated in FIG. 4K the UV adhesive sheet can be exposed to UV light by exposure through the table 160. The phosphor coated flip-chips 30 are then removed from the UV adhesive sheet (FIG. 4L).

Method 2 of Separating Phosphor Coated LED Flip-Chips

A second method in accordance with an embodiment of the invention of separating the phosphor coated LED flip-chips from the adhesive sheet is now described with reference to FIGS. 5A to 5F.

Step 1: Selective Cutting of Waste Phosphor Layer Portion (FIG. 5A to 5D)

Figure 5A:
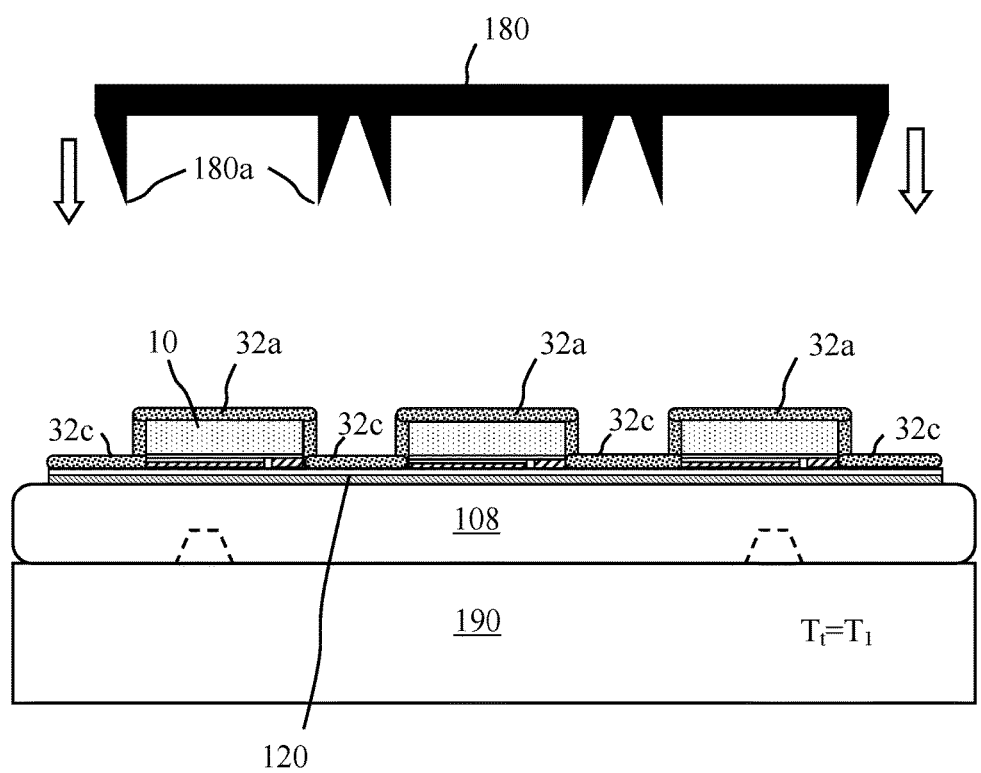
FIGS. 5A to 5F are schematic representations of a method in accordance with another embodiment of the invention for separating phosphor coated LED-flip chips.
Figure 5B:
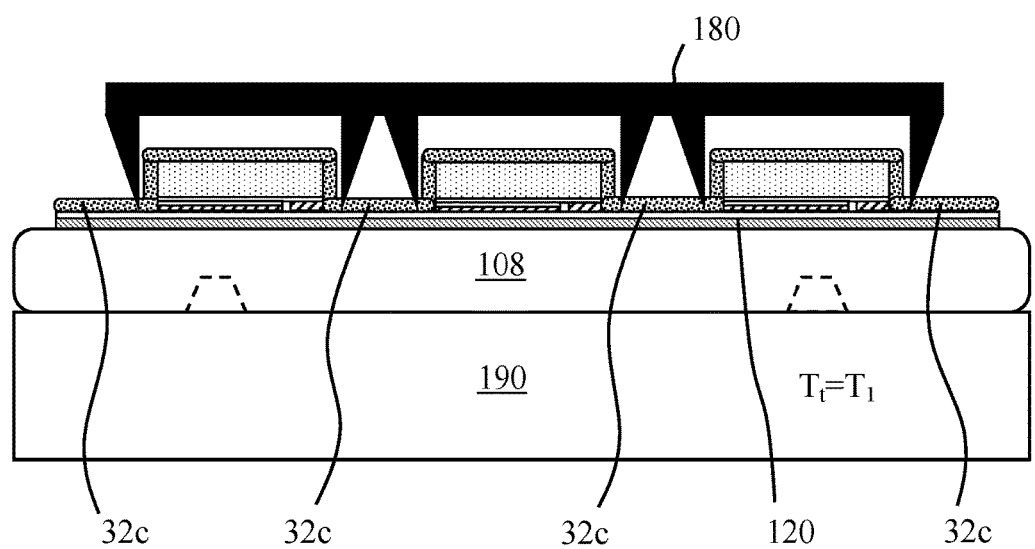
Figure 5C:
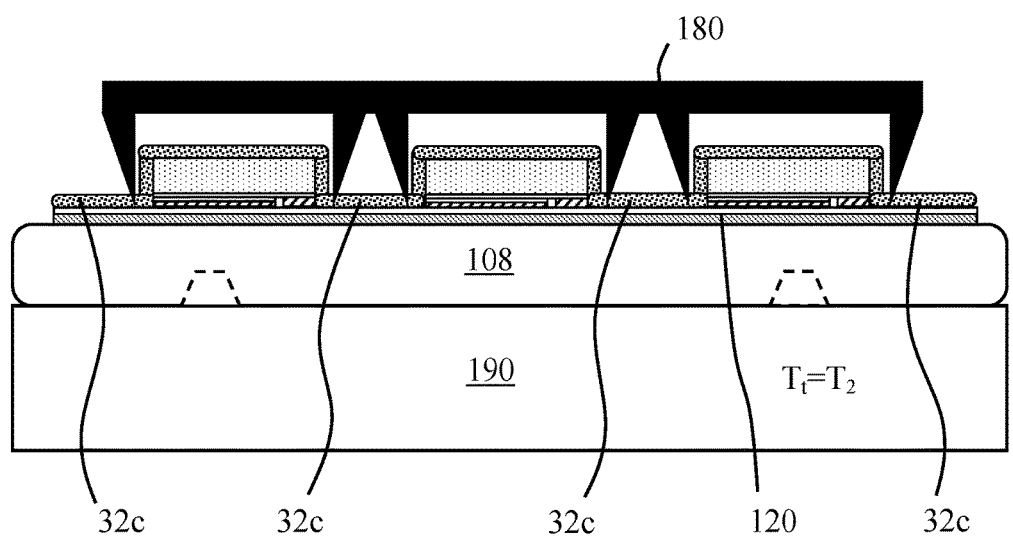
Figure 5D:
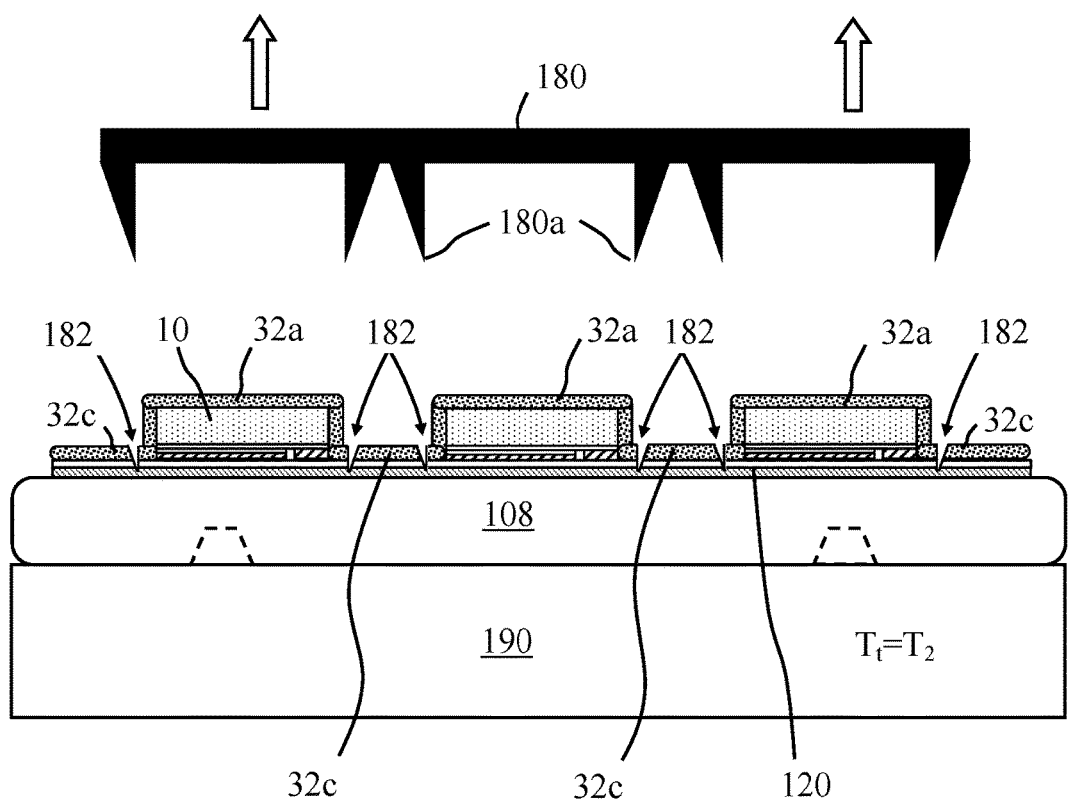

A stamp 180 (stamp) is used to physically impress into the waste phosphor layer portions 32c a grid of v-shaped grooves or channels 182 that surround each phosphor coated LED flip-chip. Since the waste phosphor layer portion 32c is uncured and deformable, blades 180a of the stamp 180 push aside the waste phosphor material portion rather than removing it. Typically the stamp 180 is composed of aluminum or steel with a coating of for example PTFE on at least the blades 180a to ensure the stamp readily releases from the phosphor layer. As indicated in the figures the stamping operation can be carried out with the adhesive sheet carrying the phosphor coated LED flip-chips mounted on the work support 108. The work support 108 can be mounted in thermal communication with a temperature controllable table (table) 190 and the temperature $T_t$ of the table 190 controlled to optimize the stamping operation. For example the table 190 can be heated to a first temperature $T_1$ to soften the waste phosphor portion 32c prior to and during stamping (FIGS. 5A and 5B). Typically temperature $T_1$ is between about 60° C. and about 100° C. Prior to removal of the stamp 180 the table 190 is cooled to a second temperature $T_2$ to harden the waste phosphor portion 32c (FIG. 5C) and reduce any closure of the grooves 182 when the stamp is removed (FIG. 5D). The table is typically cooled to a temperature $T_2$ of less than about 20° C.

Step 2: Curing of Phosphor Layer (FIG. 5E)

Figure 5E:
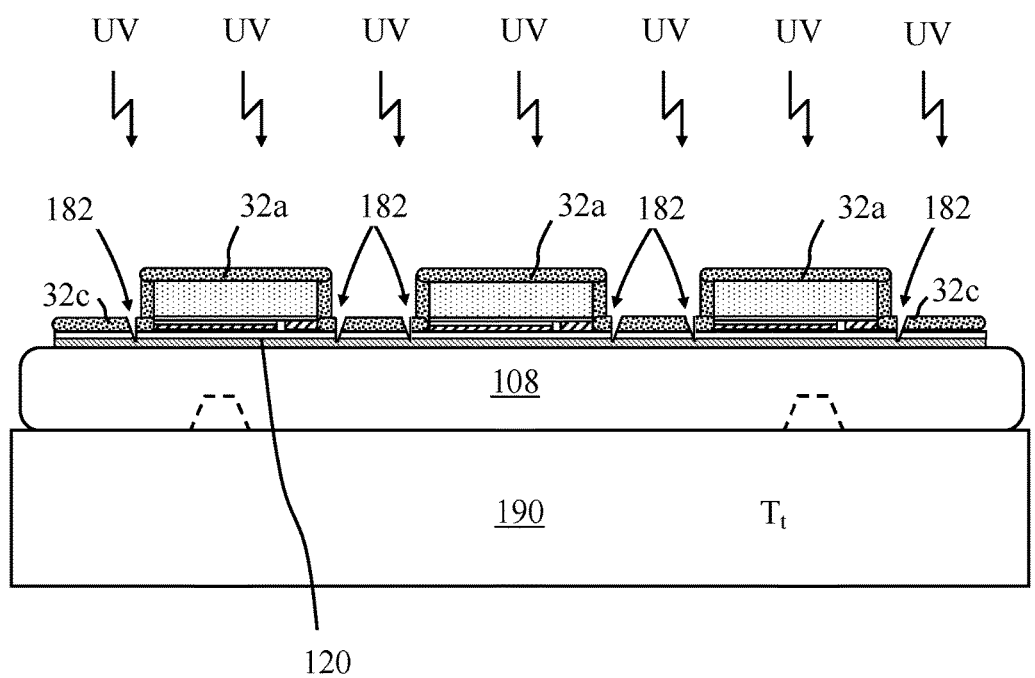

The uncured phosphor layer portions 32b, 32c are cured by exposing the array of LED flip-chips to UV light (FIG. 5E).

Figure 5F:
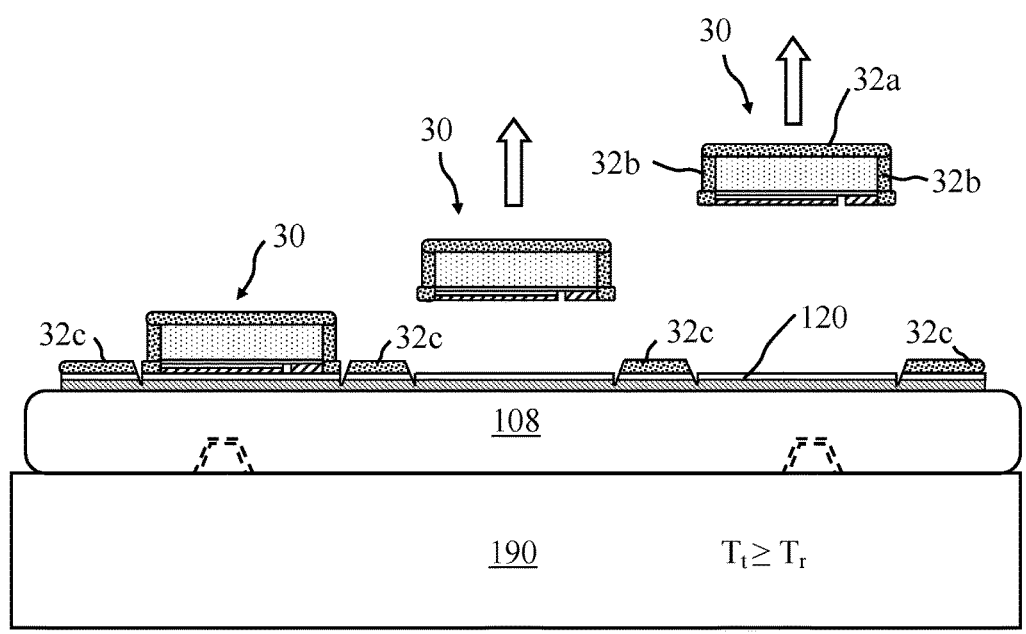

Step 3: Removal of Phosphor Coated LED Flip-Chips (FIG. 5F)

The phosphor coated flip-chips 30 are removed from the thermal adhesive sheet 120. As with first method described above the waste phosphor layer portion 32c remains on the adhesive sheet 120.

White LED Flip-Chip with Integrated Optic

Figure 6A:
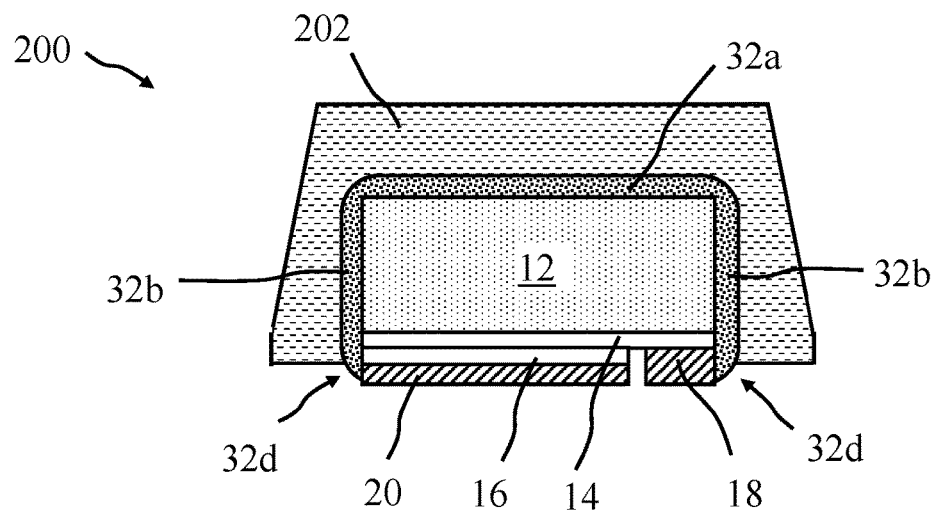
FIGS. 6A and 6B respectively show schematic sectional and plan views of a white LED flip-chip including an integrated optic in accordance with an embodiment of the invention.
Figure 6B:
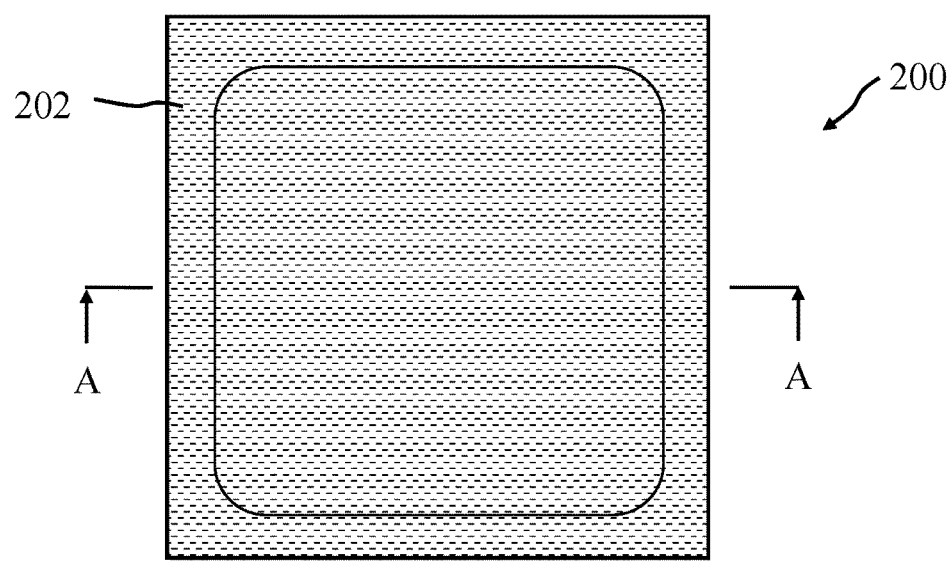

FIGS. 6A and 6B respectively show a sectional (A-A) and plan view of a white LED-flip-chip (phosphor coated LED flip-chip) 200 that further includes an integrated optic 202 formed over the phosphor layer portions 32a and 32b on the light emitting top and side faces of the LED flip-chip. The optic 202, which comprises a light transmisive material, such as for example an optical grade silicone, increases light extraction from the white LED flip-chip by reducing the refractive index change (mismatch) between the phosphor layer portions and surrounding environment (typically air). The optic 202 can further be configured such as to direct light emission from the white LED flip-chip in a selected direction. In other embodiments the optic 202 can further include a light scattering material such that the white LED-flip chip has a substantially Lambertian emission characteristic. As described below, a further benefit of the integrated optic 202 is in separating the phosphor coated LED flip-chips.

Method of Providing Integrated Optic on White LED Flip-Chips and Separating White LED Flip-Chips An example method in accordance with an embodiment of the invention of providing integrated optics on phosphor coated LED flip-chips and separating the resulting LED flip-chips is now described with reference to FIGS. 7A to 7G.

A respective optic 202 is formed on each one of the phosphor coated LED flip-chips of the array that are attached to the thermal releasable adhesive sheet 120 (FIG. 4B). As described in relation to FIG. 4B each LED flip-chip 10 has a conformal phosphor layer 32 comprising respective phosphor layer portions 32a, 32b and 32c on the light emitting top face 24, light emitting side faces 26 and between LED flip-chips. The phosphor layer portion 32a on the LED flip-chips light emitting top face 24 is selectively cured while the phosphor layer portions 32b on the LED flip-chip light emitting side faces 26 and the phosphor layer portion 32c between LED flip-chips remain in a partially (B-stage) cured state. In other embodiments the optics can be formed on the phosphor coated LED flip-chips with all the phosphor layer portions remaining in a partially cured state.

Compression Molding Optics (FIG. 7A to 7D)

A mold 204 is used to compression mold a respective optic 202 onto each LED flip-chip of the array. The mold 204 comprises a respective cavity 206 for each LED flip-chip of the array. Typically, the mold 204 is made of a thermally conductive material, such as stainless steel, to enable an optical encapsulant used to form the optics 202 to be thermally cured. Since compression molding is well known, it will not be described in detail in this specification.

A sheet of release material (not shown), typically PTFE, is placed over the mold and a preselected quantity of a thermally curable optical grade encapsulant 208 dispensed onto the mold 204. An example of suitable encapsulant is Dow Corning's OE6650 thermal curable silicone optical encapsulant. For the purposes of illustration, FIG. 7A indicates that a selected quantity of encapsulant 208 is dispensed into each mold cavity 206, though in practice it will be appreciated that a pre-selected quantity of encapsulant is typically dispensed over the surface of the mold.

Figure 7A:
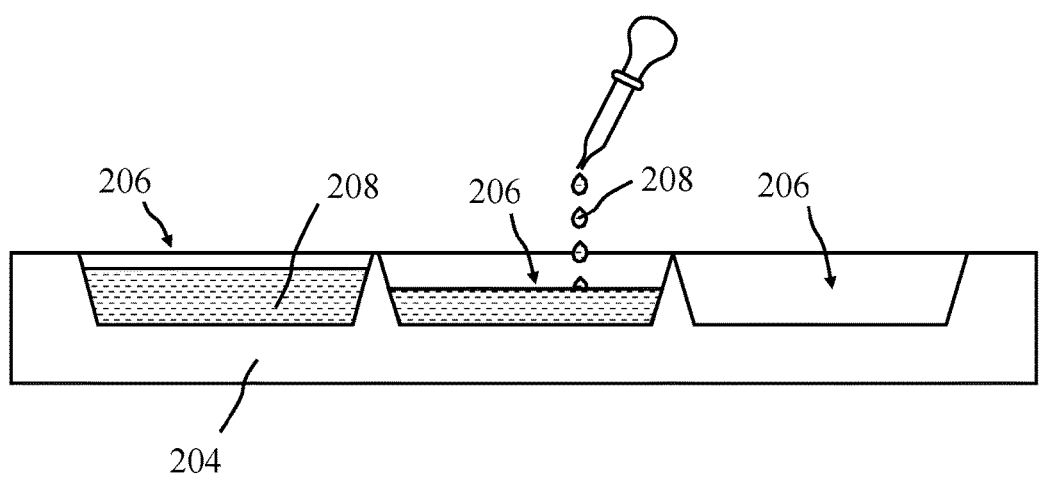
FIGS. 7A to 7G are schematic representations of a method in accordance with an embodiment of the invention for integrating an optic onto phosphor coated LED-flip chips and separating phosphor coated flip-chips.
Figure 7B:
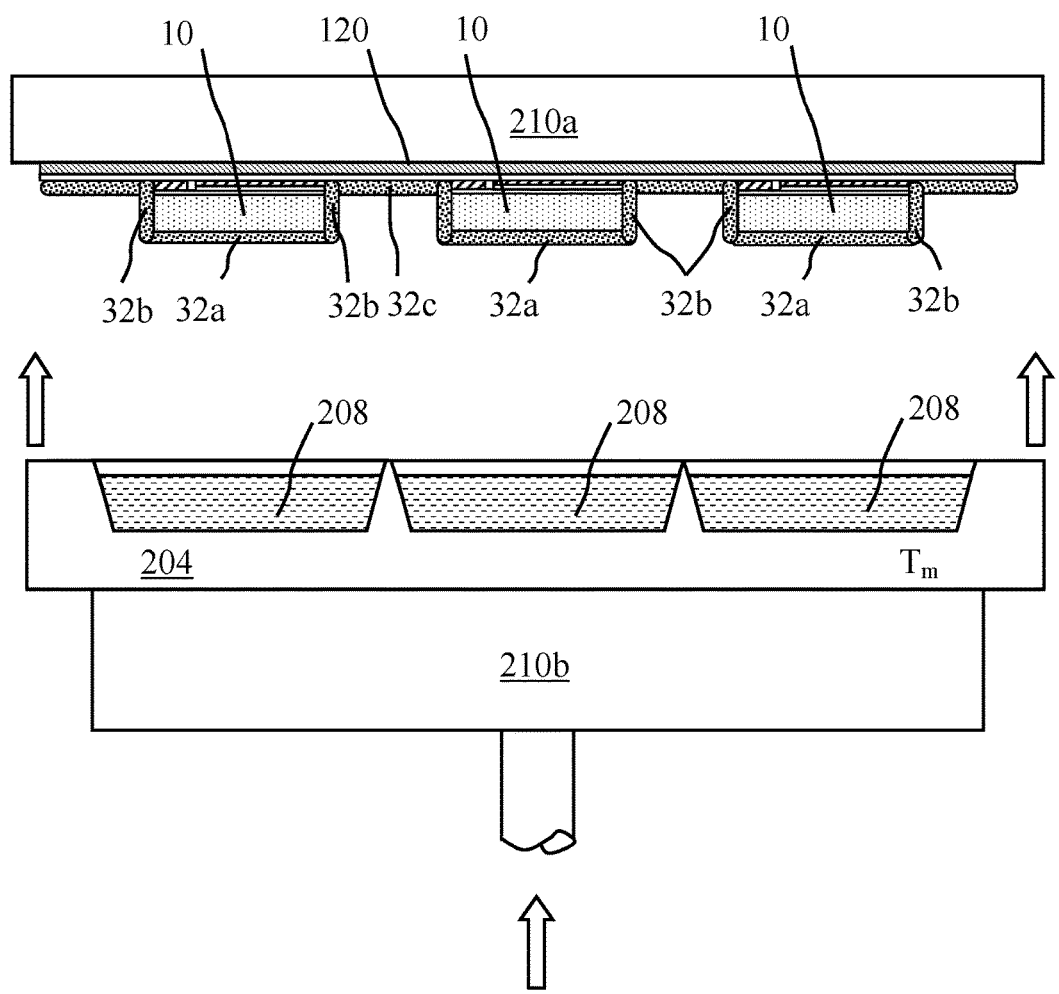
Figure 7C:
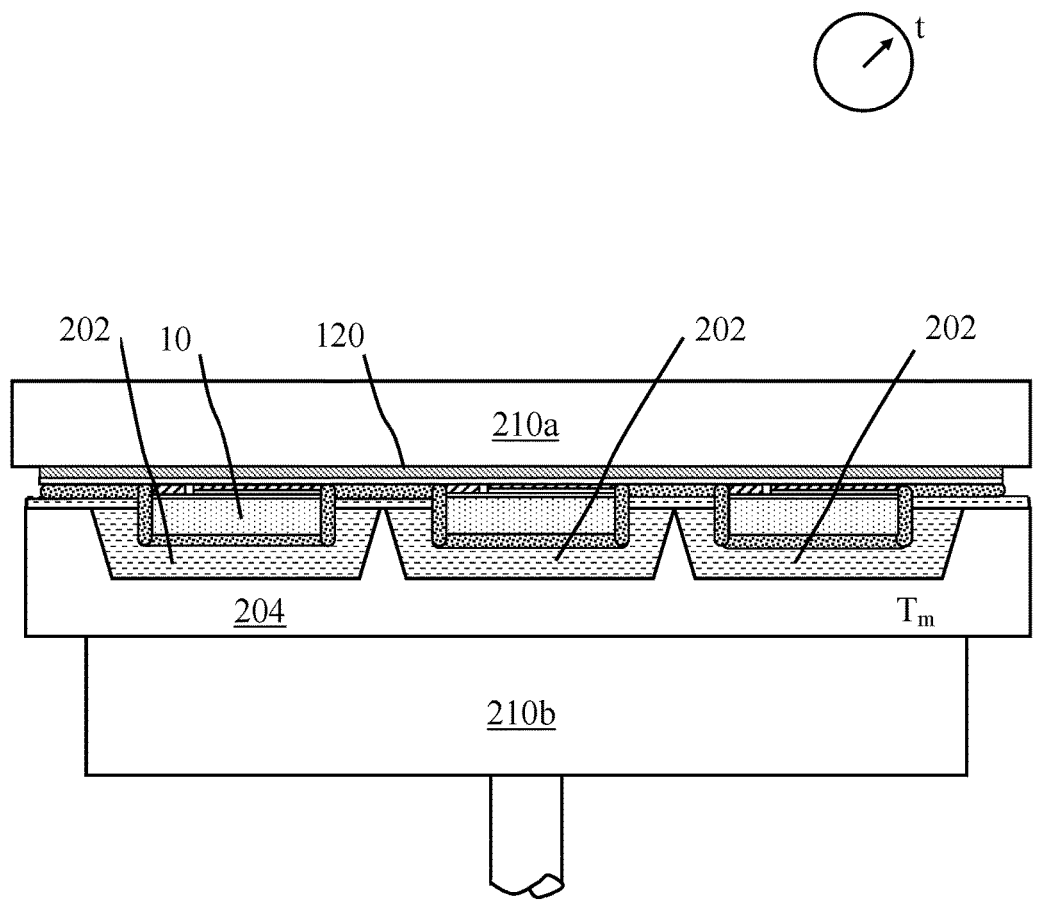
Figure 7D:
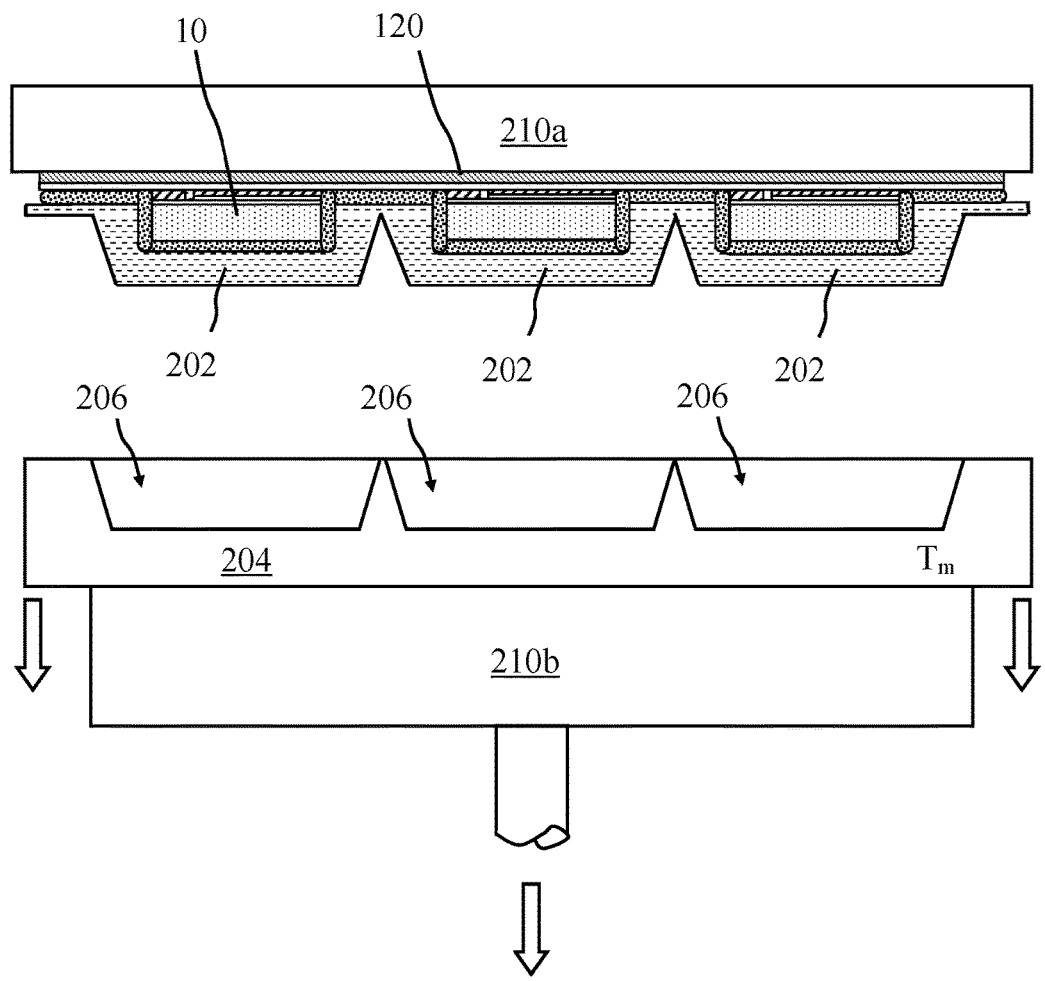

The mold 204 is located on a heated lower press plate 210b and the array of LEDs attached to an upper plate 210a of a compression mold press (FIG. 7B). The lower press plate 210b is heated to a temperature $T_m$ suitable for curing the optical encapsulant 208. The optics 202 are formed on the array of LED flip-chips under heat and pressure (FIG. 7C). After a selected period of time t, sufficient to at least partially cure the optical encapsulant such that it becomes a solid, the array of LED flip-chips including the molded optics 202 is removed from the compression mold press (FIG. 7D).

Figure 7E:
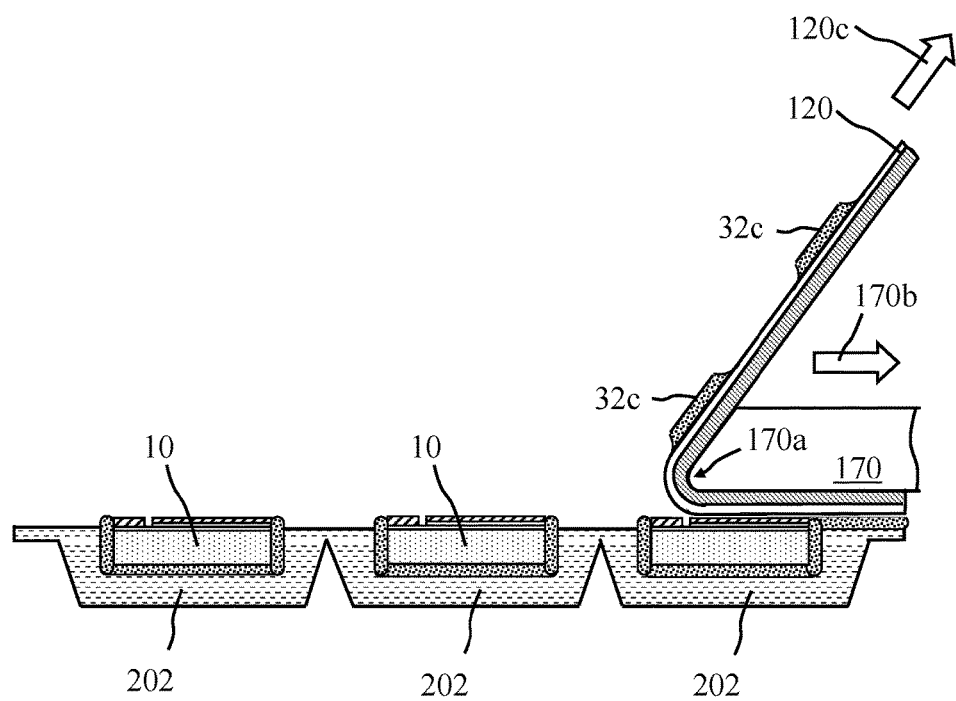

Removal of Waste Phosphor Layer Portion (FIG. 7E)

As illustrated in FIG. 7E, the thermal releasable adhesive sheet 120 together with the waste phosphor layer portions 32c can be removed from the array of phosphor coated flip-chips using, for example, the method described in relation to FIG. 4I. In contrast to the earlier method in which the array of phosphor coated LEDs was attached to a table to enable removal of the adhesive sheet 120, the optics 202 provide a supporting structure for the array of LEDs enabling removal of the sheet 120 and waste phosphor layer 32c portions.

A moveable heated plate (plate) 170 is positioned on top of the adhesive sheet 120 which is moveable relative to the array of LEDs in a horizontal direction indicated by arrow 170b. The plate 170 is heated to a temperature $T_{pt}$ (about 170° C.) that is above the release temperature $T_r$ of the adhesive sheet 120 and sufficiently high to cause flow of the uncured portions of the phosphor layer (i.e. the waste phosphor layer portions 32c and phosphor layer portions 32b). Whilst the adhesive sheet 120 readily releases from rigid surfaces such as metallic or semiconductor material surfaces (e.g. LED flip-chips) it does not readily release from deformable material such as the phosphor film which is composed of silicone. Once the adhesive sheet 120 has been heated above its release temperature $T_r$ and the partially cured phosphor layer portions 32b, 32c are softened, one edge 120b of the adhesive sheet 120 is drawn over the rounded edge 170a of the plate 170 in a direction 120c that is upward and over the plate 170 towards the opposite edge of the adhesive sheet. The operation of peeling the adhesive sheet 120 moves the plate in the direction 120c and separates the adhesive sheet from the LED-flip chips. The weight of the plate helps to ensure clean removal of the waste phosphor layer portions 32c which remain attached to the adhesive sheet 120. The partially cures phosphor layer portions 32b, 32c are heated to a temperature at which they soften and begin to flow to facilitate separation of the phosphor layer portions at their junction.

If not already fully cured, the optics 202 can be fully cured by further heating the array of LED flip-chips (Not shown).

Figure 7F:
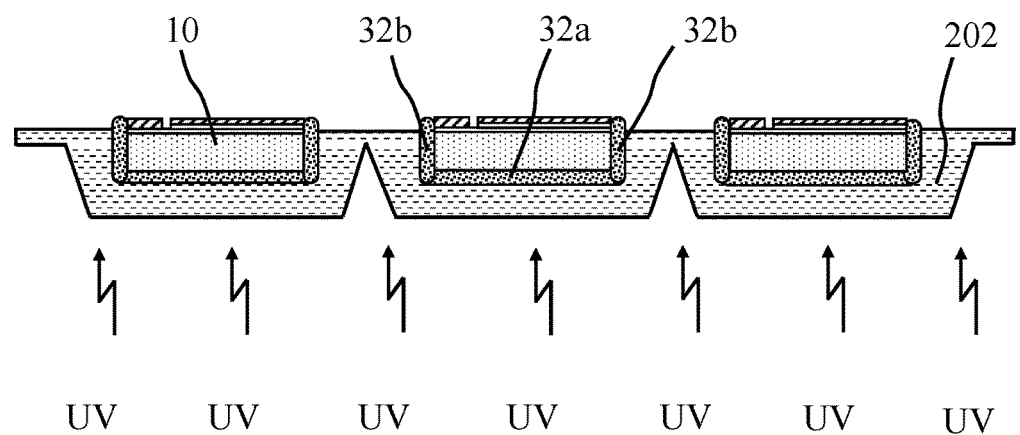

Final Curing of Phosphor Layer Portions (FIG. 7F)

Optionally the uncured phosphor layer portions 32b covering the light emitting edges of the LED flip-chips is cured by exposing the array of LED flip-chips to UV light (FIG. 7F).

Figure 7G:
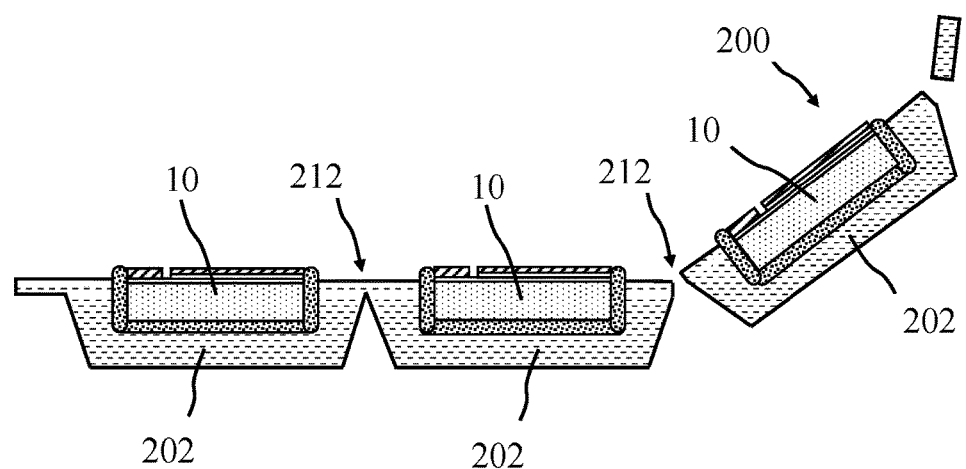

Separating the White LED Flip-Chips (FIG. 7G)

The phosphor coated LED flip-chips of the array are attached to their neighbor by connecting portions 212 of the optics 202. By appropriate selection of the mold cavity 206 the connecting portions 212 can be configured to be thin enough for the white LED flip-chip with integrated optic to be separated into individual components by snapping along the connecting portions 212. In alternative embodiments where the optical encapsulant is not brittle enough to be reliably snapped, the white LED flip-chips can be separated into individual components by cutting or sawing along the connecting portions 212 ("streets" and "avenues").

Figure 8A:
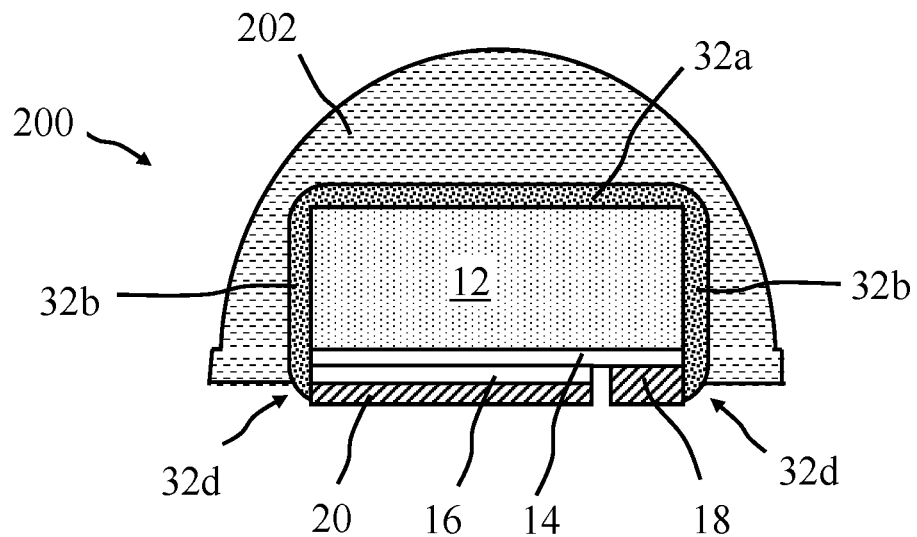
FIGS. 8A and 8B respectively show schematic sectional and plan views of a white LED flip-chip including an integrated optic in accordance with an embodiment of the invention.
Figure 8B:
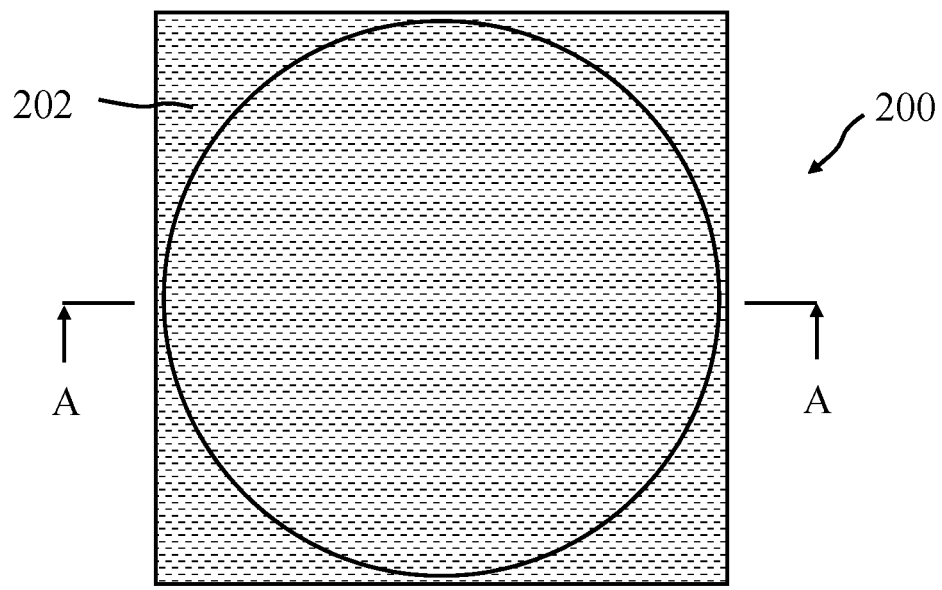

FIGS. 8A and 8B respectively show a sectional (A-A) and plan view of a white LED-flip-chip (phosphor coated LED flip-chip) 200 that further includes an integrated optic 202 formed over the phosphor layer portions 32a and 32b. In this embodiment the optics 202 comprise a substantially hemispherical lens. It will be appreciated that any form of optic can be fabricated using an appropriately shaped mold cavity.

It will be appreciated that the methods and apparatus for laminating a phosphor film onto LED chips in accordance with embodiments of the invention are not limited to the embodiments described and that modifications can be made without departing from the scope of the invention.

For example, whilst the invention arose in relation to applying a phosphor coating to LED flip-chips, the invention can also be applied to other LED chip configurations such as for example those using bond wires.

What we claim:

1. A photoluminescence sheet comprising:
   a polymer sheet comprising a UV-curable polymer having properties of being thermoplastic that is thermally reflowable and in a partially cured state, the polymer sheet having particles of at least one photoluminescence material homogeneously distributed throughout its volume,
   wherein the partially cured state corresponds to a state where the UV curable polymer is not a fully cross-linked long-chain polymer.

2. The photoluminescence sheet of claim 1, wherein the polymer sheet is selected from the group consisting of:
   a partially cured UV-curable resin; a partially cured UV-curable urethane acrylate resin; a partially cured UV-curable acrylic acrylate resin; a partially cured UV-curable epoxy acrylate resin; a partially cured UV-curable silicone resin; and a partially cured UV-curable epoxy resin.

3. The photoluminescence sheet of claim 1, wherein a thickness of the photoluminescence sheet is selected from the group consisting of: between about 50 µm and about 150 µm; and between about 50 µm and about 70 µm.

4. The photoluminescence sheet of claim 1, wherein a variation in thickness of the photoluminescence sheet is less than about 2%.

5. The photoluminescence sheet of claim 1, wherein a weight loading of the at least one photoluminescence material is between about 40% and about 70% of the total sheet weight.

6. The photoluminescence sheet of claim 1, wherein a weight loading of the at least one photoluminescence material is between about 40% and about 50% of the total sheet weight.

7. The photoluminescence sheet of claim 1, wherein a weight loading of the at least one photoluminescence material is between about 60% and about 70% of the total sheet weight.

8. The photoluminescence sheet of claim 1, wherein the sheet is selected from the group consisting of: being configured to generate "cool white" light when excited by excitation light and being configured to generate "warm white" light when excited by excitation light.

9. The photoluminescence sheet of claim 1, wherein the photoluminescence sheet when excited by excitation light generates white light having a color rendering index of greater than 90.

10. The photoluminescence sheet of claim 1, wherein the at least one photoluminescence material comprises a phosphor with a particle size between about 8 µm and about 15 µm.

11. The photoluminescence sheet of claim 1, wherein the UV-curable polymer is partially cured to about 10% or less of full curing.

12. The photoluminescence sheet of claim 1, wherein the UV-curable polymer softens and becomes stretchable at a temperature of about 160° C.

13. The photoluminescence sheet of claim 1, wherein the UV-curable polymer begins to flow at temperature of about 160° C.

14. A white light emitting device comprising:
    an LED chip having a light emitting top face, light emitting side faces and bottom face; and
    a wavelength conversion layer of substantially uniform thickness on the light emitting top face and light emitting side faces of the LED chip, wherein the wavelength conversion layer comprises a preformed photoluminescence sheet comprising particles of at least one photoluminescence material that is applied onto the light emitting top and side faces of the LED chip and wherein a thickness of the wavelength conversion layer is between about 50 µm and about 150 µm and wherein a thickness of the wavelength conversion layer on the light emitting side faces of the LED chip is between about 95% and 100% of the thickness of the wavelength conversion layer on the light emitting top face of the LED chip.

15. The white light emitting device of claim 14, wherein a thickness of the wavelength conversion layer is between about 50 µm and about 70 µm.

16. The white light emitting device of claim 14, wherein a thickness of the wavelength conversion layer is between about 70 µm and about 100 µm.

17. The white light emitting device of claim 14, wherein the wavelength conversion layer has a variation in thickness of less than about 2%.

18. The white light emitting device of claim 14, wherein the region of the wavelength conversion layer on the light emitting side faces of the LED chip adjacent to the bottom face of the LED chip extends beyond the wavelength conversion layer on the light emitting side faces of LED chips a distance less than 20 µm.

19. The white light emitting device of claim 14, wherein the wavelength conversion layer on the light emitting side faces of the LED chips tapers in thickness in region adjacent to the bottom face of the LED chip.

20. The white light emitting device of claim 14, and further comprising a light transmissive optic covering the wavelength conversion layer.

21. The white light emitting device of claim 14, wherein the LED chip comprises a flip-chip.

22. A white light emitting device comprising:
    an LED chip having a light emitting top face, light emitting side faces and bottom face; and
    a wavelength conversion layer of substantially uniform thickness on the light emitting top face and light emitting side faces of the LED chip, wherein the wavelength conversion layer comprises a preformed photoluminescence sheet comprising particles of at least one photoluminescence material that is applied onto the light emitting top and side faces of the LED chip, and wherein a region of the wavelength conversion layer on the light emitting side faces of the LED chip adjacent to the bottom face of the LED chip extends beyond the wavelength conversion layer on the light emitting side faces of LED chip up to a distance of 20 µm or does not extend beyond the wavelength conversion layer on the light emitting side faces of LED chip.

23. The white light emitting device of claim 22, wherein the wavelength conversion layer is of a thickness of between about 50 μm and about 70 μm.

* * * * *